US012477796B2

(12) United States Patent
Cho et al.

(10) Patent No.: US 12,477,796 B2
(45) Date of Patent: Nov. 18, 2025

(54) SEMICONDUCTOR DEVICE INCLUDING A VERTICALLY STACKED CHANNEL PATTERN AND METHOD FOR MANUFACTURING THE SAME

(71) Applicant: Samsung Electronics Co., Ltd., Suwon-si (KR)

(72) Inventors: Namkyu Cho, Suwon-si (KR); Seokhoon Kim, Suwon-si (KR); Jeongho Yoo, Suwon-si (KR); Choeun Lee, Suwon-si (KR); Pankwi Park, Suwon-si (KR); Dongsuk Shin, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 487 days.

(21) Appl. No.: 18/050,684

(22) Filed: Oct. 28, 2022

(65) Prior Publication Data

US 2023/0326970 A1 Oct. 12, 2023

(30) Foreign Application Priority Data

Apr. 12, 2022 (KR) .................. 10-2022-0045168

(51) Int. Cl.
*H10D 62/13* (2025.01)
*B82Y 10/00* (2011.01)
(Continued)

(52) U.S. Cl.
CPC ......... *H10D 62/151* (2025.01); *H10D 30/014* (2025.01); *H10D 30/43* (2025.01);
(Continued)

(58) Field of Classification Search
CPC .............. H10D 64/018; H10D 64/021; H10D 84/0184; H10D 64/259; H10D 84/017;
(Continued)

(56) References Cited

U.S. PATENT DOCUMENTS 9,647,098 B2 5/2017 Obradovic et al.
9,929,266 B2 3/2018 Balakrishnan et al.
(Continued)

FOREIGN PATENT DOCUMENTS

KR 10-2021-0086942 A 7/2021

*Primary Examiner* — Sonya McCall-Shepard
(74) *Attorney, Agent, or Firm* — Harness, Dickey & Pierce, P.L.C.

(57) ABSTRACT

A semiconductor device includes a substrate including a first active pattern, a first channel pattern on the first active pattern, the first channel pattern including first, second, and third semiconductor patterns spaced apart from one another and vertically stacked, a first source/drain pattern connected to the first to third semiconductor patterns, and a gate electrode on the first to third semiconductor patterns. The first source/drain pattern includes a first protrusion protruding toward the first semiconductor pattern, a second protrusion protruding toward the second semiconductor pattern, and a third protrusion protruding toward the third semiconductor pattern. A width of the second protrusion is greater than a width of the first protrusion. A width of the third protrusion is greater than the width of the second protrusion.

18 Claims, 31 Drawing Sheets

(51) Int. Cl.

| | |
|---|---|
| *H01L 21/768* | (2006.01) |
| *H01L 23/48* | (2006.01) |
| *H01L 23/522* | (2006.01) |
| *H10D 30/01* | (2025.01) |
| *H10D 30/43* | (2025.01) |
| *H10D 30/67* | (2025.01) |
| *H10D 30/69* | (2025.01) |
| *H10D 62/10* | (2025.01) |
| *H10D 62/17* | (2025.01) |
| *H10D 62/40* | (2025.01) |
| *H10D 62/822* | (2025.01) |
| *H10D 62/832* | (2025.01) |
| *H10D 64/01* | (2025.01) |
| *H10D 64/23* | (2025.01) |
| *H10D 84/01* | (2025.01) |
| *H10D 84/03* | (2025.01) |
| *H10D 84/85* | (2025.01) |

(52) U.S. Cl.
CPC ..... *H10D 30/6729* (2025.01); *H10D 30/6735* (2025.01); *H10D 30/6757* (2025.01); *H10D 64/01* (2025.01); *H10D 64/018* (2025.01); *H10D 64/021* (2025.01); *H10D 64/259* (2025.01); *H10D 84/0167* (2025.01); *H10D 84/017* (2025.01); *H10D 84/0186* (2025.01); *H10D 84/038* (2025.01); *H10D 84/85* (2025.01); *H10D 62/121* (2025.01)

(58) Field of Classification Search
CPC ............. H10D 84/0186; H10D 30/797; H10D 64/256; H10D 62/151; H10D 30/014; H10D 30/43; H10D 30/6735; H10D 30/6757; H10D 30/6713
See application file for complete search history.

(56) References Cited

U.S. PATENT DOCUMENTS

| | | |
|---|---|---|
| 10,312,337 B2 | 6/2019 | Balakrishnan et al. |
| 10,439,049 B2 | 10/2019 | Basker et al. |
| 10,504,900 B2 | 12/2019 | Hashemi et al. |
| 10,714,392 B2 | 7/2020 | Loubet et al. |
| 11,164,960 B1 | 11/2021 | Zhang et al. |
| 11,227,956 B2 | 1/2022 | Yeong et al. |
| 11,342,326 B2 * | 5/2022 | Chiu ................... H10D 30/6757 |
| 2013/0045589 A1 | 2/2013 | Kim et al. |
| 2017/0256609 A1 | 9/2017 | Bhuwalka et al. |
| 2019/0341467 A1 | 11/2019 | Basker et al. |
| 2020/0044060 A1 | 2/2020 | Cheng et al. |
| 2020/0365586 A1 | 11/2020 | Shin et al. |
| 2021/0175367 A1 | 6/2021 | Chen et al. |
| 2021/0359125 A1 | 11/2021 | Liang et al. |
| 2022/0069078 A1 | 3/2022 | Yu et al. |
| 2023/0063612 A1 * | 3/2023 | Lin ........................ H10D 30/43 |

* cited by examiner

SEMICONDUCTOR DEVICE INCLUDING A VERTICALLY STACKED CHANNEL PATTERN AND METHOD FOR MANUFACTURING THE SAME

CROSS-REFERENCE TO RELATED APPLICATION

This U.S. non-provisional patent application claims priority under 35 U.S.C. § 119 to Korean Patent Application No. 10-2022-0045168, filed on Apr. 12, 2022, in the Korean Intellectual Property Office, the entire contents of which are hereby incorporated by reference.

BACKGROUND

The inventive concepts relate to semiconductor devices and methods of manufacturing the same, and more particularly, relates to semiconductor devices including a field effect transistor and methods of manufacturing the same.

A semiconductor device includes an integrated circuit composed of a metal oxide semiconductor (MOS) field effect transistors (FET). As a size of the semiconductor device and design rule are gradually reduced, scale down of the MOS field effect transistor is increasingly accelerating. As the size of the MOS field effect transistor is reduced, operating characteristics of the semiconductor device may be deteriorated. Accordingly, various methods of manufacturing the semiconductor device with superior performance while overcoming limitations due to high integration of the semiconductor device are being studied.

SUMMARY

Some example embodiments of the inventive concepts provide a semiconductor device with improved reliability.

Some example embodiments of the inventive concepts provide a method of manufacturing a semiconductor device with improved reliability.

According to some example embodiments of the inventive concepts, a semiconductor device may include a substrate including a first active pattern, a first channel pattern on the first active pattern, the first channel pattern including first, second, and third semiconductor patterns spaced apart from one another and vertically stacked in a vertical direction extending perpendicular to an upper surface of the substrate, a first source/drain pattern connected to the first to third semiconductor patterns, and a gate electrode on the first to third semiconductor patterns. The first source/drain pattern may include a first protrusion protruding toward the first semiconductor pattern in a horizontal direction extending parallel to the upper surface of the substrate, a second protrusion protruding toward the second semiconductor pattern in the horizontal direction, and a third protrusion protruding toward the third semiconductor pattern in the horizontal direction. A width of the second protrusion in the horizontal direction may be greater than a width of the first protrusion in the horizontal direction. A width of the third protrusion in the horizontal direction may be greater than the width of the second protrusion in the horizontal direction.

According to some example embodiments of the inventive concepts, a semiconductor device may include a first channel pattern on the first active pattern, the first channel pattern including first, second, and third semiconductor patterns spaced apart from one another and vertically stacked in a vertical direction extending perpendicular to an upper surface of the substrate, a second channel pattern on the second active pattern, the second channel pattern including fourth, fifth, and sixth semiconductor patterns spaced apart from one another and vertically stacked in the vertical direction, a first source/drain pattern connected to the first to third semiconductor patterns, a second source/drain pattern connected to the fourth to sixth semiconductor patterns, and a gate electrode extending from the first channel pattern to the second channel pattern. The second source/drain pattern may have a conductivity type different from a conductivity type of the first source/drain pattern. The gate electrode may include a first portion, a second portion, and a third portion adjacent to each of the fourth to sixth semiconductor patterns. The first source/drain pattern may include a first protrusion protruding toward the first semiconductor pattern in a horizontal direction extending in parallel with the upper surface of the substrate, a second protrusion protruding toward the second semiconductor pattern in the horizontal direction, and a third protrusion protruding toward the third semiconductor pattern in the horizontal direction. The second source/drain pattern may include a fourth protrusion protruding toward the first portion in the horizontal direction, a fifth protrusion protruding toward the second portion in the horizontal direction, and a sixth protrusion protruding toward the third portion in the horizontal direction.

According to some example embodiments of the inventive concepts, a semiconductor device may include a substrate including an active region, a device isolation layer defining an active pattern on the active region, a channel pattern and a source/drain pattern on the active pattern, the channel pattern including first, second, and third semiconductor patterns spaced apart from one another and vertically stacked in a vertical direction extending perpendicular to an upper surface of the substrate, a gate electrode on the first to third semiconductor patterns, a gate insulating layer between the first to third semiconductor patterns and the gate electrode, a gate spacer on a sidewall of the gate electrode, a gate capping pattern on a top surface of the gate electrode, an interlayer insulating layer on the gate capping pattern, an active contact electrically connected to the source/drain pattern through the interlayer insulating layer, a metal-semiconductor compound layer interposed between the active contact and the source/drain pattern, a gate contact passing through the interlayer insulating layer and the gate capping pattern and electrically connected to the gate electrode, a first metal layer on the interlayer insulating layer, the first metal layer including a power wiring and first wirings electrically connected to the active contact and the gate contact, respectively, and a second metal layer on the first metal layer. The second metal layer may include second wirings electrically connected to the first metal layer. The source/drain pattern may include a first protrusion protruding toward the first semiconductor pattern in a horizontal direction extending parallel to the upper surface of the substrate, a second protrusion protruding toward the second semiconductor pattern in the horizontal direction, and a third protrusion protruding toward the third semiconductor pattern in the horizontal direction. A length of the second semiconductor pattern in the horizontal direction may be greater than a length of the third semiconductor pattern in the horizontal direction. A length of the first semiconductor pattern in the horizontal direction may be greater than the length of the second semiconductor pattern in the horizontal direction.

According to some example embodiments of the inventive concepts, a method of manufacturing a semiconductor device may include forming a stacked pattern on a substrate, the stacked pattern including active layers and sacrificial layers alternately stacked, forming a sacrificial pattern extending in a first direction on the stacked pattern, the first direction extending in parallel with an upper surface of the substrate, etching the stacked pattern using the sacrificial pattern as a mask to form a recess in the stacked pattern, the active layers including first, second, and third semiconductor patterns exposed by the recess, performing a selective etching process on the sacrificial layers exposed by the recess to form indent regions, forming inner spacers, respectively, in the indent regions, performing a selective etching process on the first, second, and third semiconductor patterns exposed by the recess to form first, second, and third channel recesses, respectively, forming a source/drain pattern in the recess, removing the sacrificial pattern and the sacrificial layers to expose the first to third semiconductor patterns, and sequentially forming a gate insulating layer and a gate electrode on the exposed first to third semiconductor patterns. The forming of the source/drain pattern may include growing an epitaxial layer filling the first to third channel recesses and covering the inner spacers.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION

Figure 1:
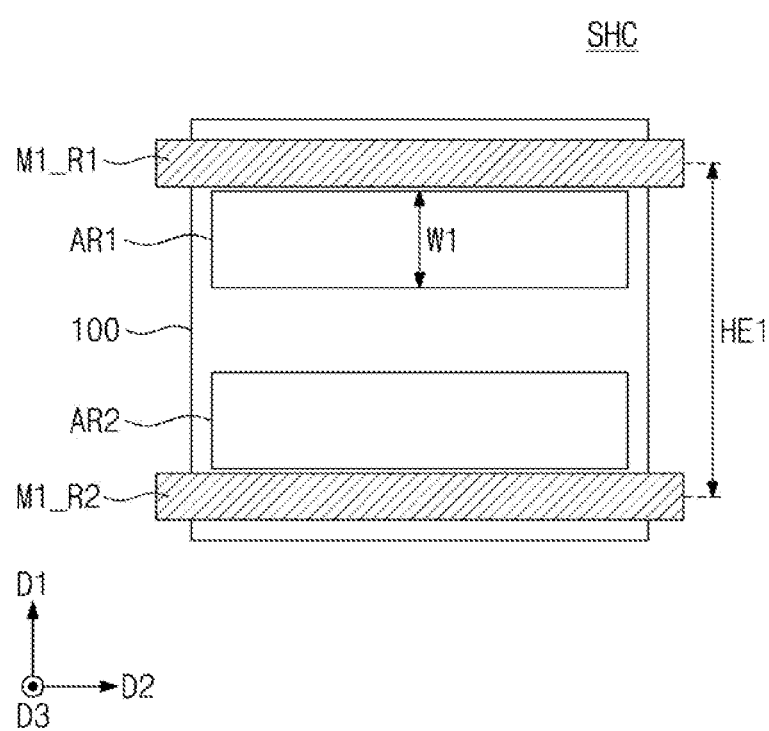
FIGS. 1, 2, and 3 are conceptual views for illustrating logic cells of a semiconductor device according to some example embodiments of the inventive concepts.

Hereinafter, some example embodiments will be described in detail with reference to the accompanying drawings.

It will be understood that when an element is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

While the term "same," "equal" or "identical" may be used in description of some example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

As described herein, when an operation is described to be performed "by" performing additional operations, it will be understood that the operation may be performed "based on" the additional operations, which may include performing said additional operations alone or in combination with other further additional operations.

As described herein, an element that is described to be "spaced apart" from another element, in general and/or in a particular direction (e.g., vertically spaced apart, laterally spaced apart, etc.) and/or described to be "separated from" the other element, may be understood to be isolated from direct contact with the other element, in general and/or in the particular direction (e.g., isolated from direct contact with the other element in a vertical direction, isolated from direct contact with the other element in a lateral or horizontal direction, etc.). Similarly, elements that are described to be "spaced apart" from each other, in general and/or in a particular direction (e.g., vertically spaced apart, laterally spaced apart, etc.) and/or are described to be "separated" from each other, may be understood to be isolated from direct contact with each other, in general and/or in the particular direction (e.g., isolated from direct contact with each other in a vertical direction, isolated from direct contact with each other in a lateral or horizontal direction, etc.).

As described herein, elements that are described to be in "contact" with each other may be interchangeably referred to as being in "direct contact" with each other. As described herein, elements that are described to "contact" other elements may be interchangeably referred to "directly contact" the other elements.

Figure 2:
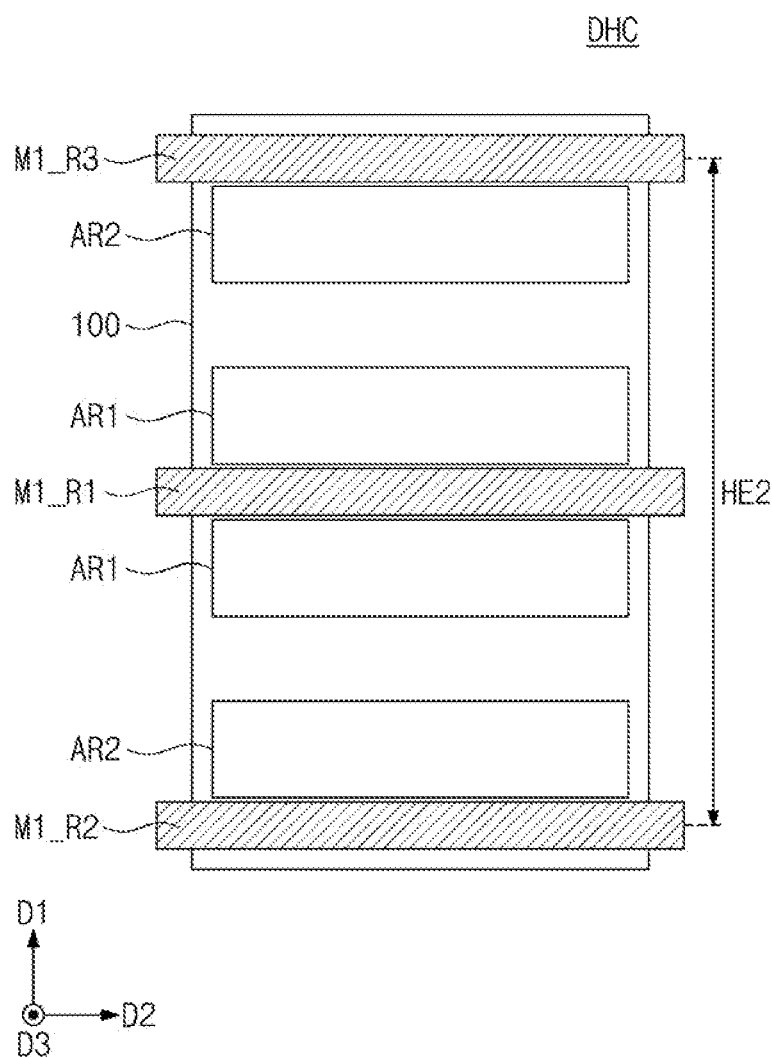
Figure 3:
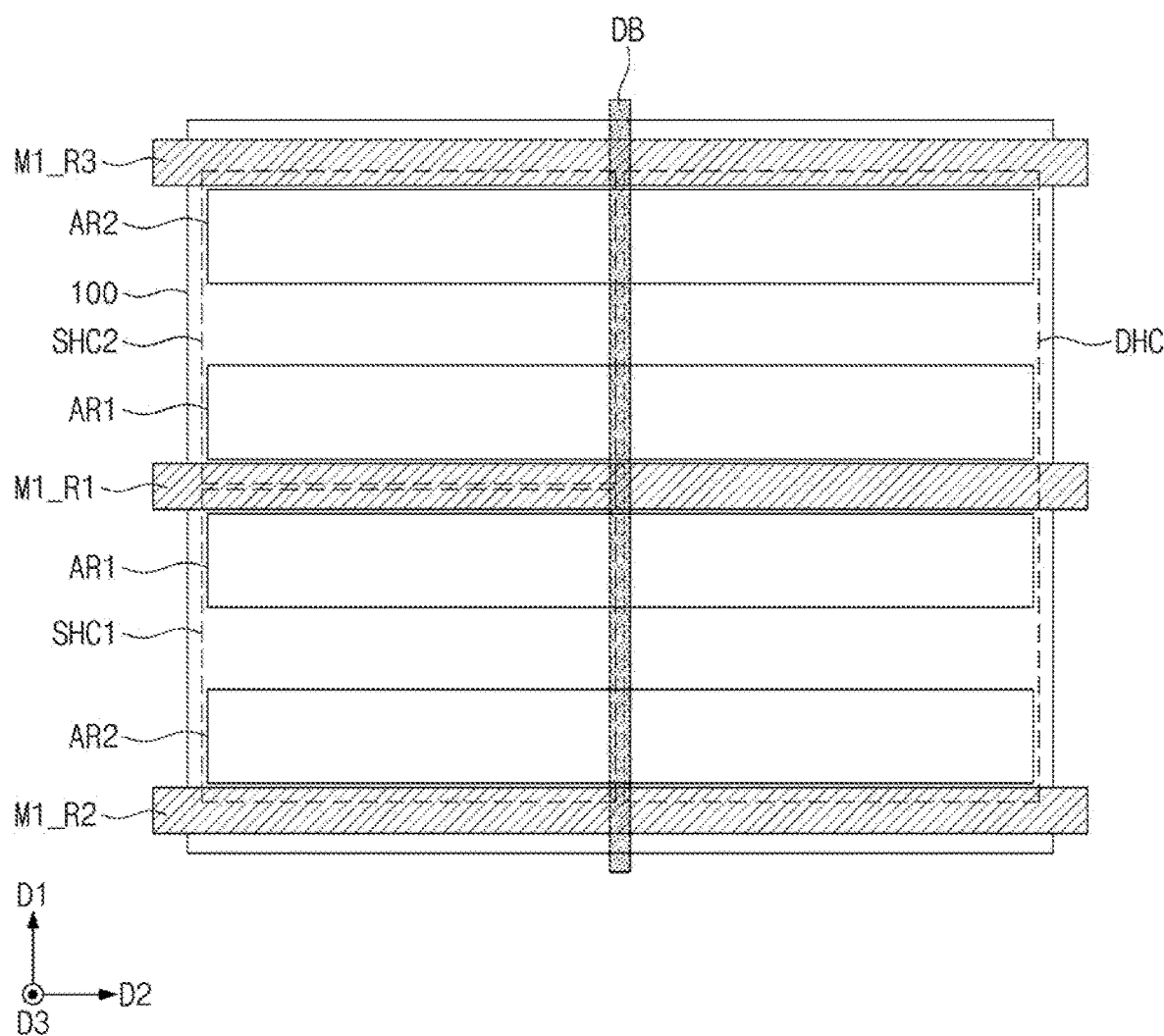

FIGS. 1, 2, and 3 are conceptual views for illustrating logic cells of a semiconductor device according to some example embodiments of the inventive concepts.

Referring to FIG. 1, a single height cell SHC may be provided. In detail, a first power wiring M1_R1 and a second power wiring M1_R2 may be provided on a substrate 100. The first power wiring M1_R1 may be a path through which a source voltage VSS, for example, a ground voltage is provided. The second power wiring M1_R2 may be a passage through which a drain voltage VDD, for example, a power voltage is provided.

A single height cell SHC may be defined between the first power wiring M1_R1 and a second power wiring M1_R2. The single height cell SHC may include one first active region AR1 and one second active region AR2. One of the first and second active regions AR1 and AR2 may be a PMOSFET region, and the other of the first and second active regions AR1 and AR2 may be an NMOSFET region. That is, the single height cell SHC may have a CMOS structure provided between the first power wiring M1_R1 and the second power wiring M1_R2.

Each of the first and second active regions AR1 and AR2 may have a first width W1 in a first direction D1. A length of the single height cell SHC in the first direction D1 may be defined as s first height HE1. The first height HE1 may be substantially equal to a distance (e.g., a pitch) between the first power wiring M1_R1 and the second power wiring M1_R2.

The single height cell SHC may constitute one logic cell. In this specification, a logic cell may mean a logic element (e.g., AND, OR, XOR, XNOR, inverter, etc.) that performs a specific function. That is, the logic cell may include transistors constituting a logic device and wirings connecting the transistors to one another.

Referring to FIG. 2, a double height cell DHC may be provided. In detail, a first power wiring M1_R1, a second power wiring M1_R2, and a third power wiring M1_R3 may be provided on a substrate 100. The first power wiring M1_R1 may be disposed between the second power wiring M1_R2 and the third power wiring M1_R3. The third power wiring M1_R3 may be a path through which a source voltage VSS is provided.

The double height cell DHC may be defined between the second power wiring M1_R2 and the third power wiring M1_R3. The double height cell DHC may include two first active regions AR1 and two second active regions AR2.

One of the two second active regions AR2 may be adjacent to the second power wiring M1_R2. The other of the two second active regions AR2 may be adjacent to the third power wiring M1_R3. The two first active regions AR1 may be adjacent to the first power wiring M1_R1. In a plan view, the first power wiring M1_R1 may be disposed between the two first active regions AR1.

A length of the double height cell DHC in a first direction D1 may be defined as a second height HE2. The second height HE2 may be about twice the first height HE1 of FIG. 1. The two first active regions AR1 of the double height cell DHC may be grouped to operate as one active region.

In the inventive concepts, the double height cell DHC shown in FIG. 2 may be defined as a multi-height cell. Although not shown, the multi-height cell may include a triple-height cell having a cell height approximately three times the height of the single height cell SHC.

Referring to FIG. 3, a first single height cell SHC1, a second single height cell SHC2, and a double height cell DHC may be two-dimensionally disposed on a substrate 100. The first single height cell SHC1 may be disposed between first and second power wirings M1_R1 and M1_R2. The second single height cell SHC2 may be disposed between first and third power wirings M1_R1 and M1_R3. The second single height cell SHC2 may be adjacent to the first single height cell SHC1 in a first direction D1.

The double height cell DHC may be disposed between the second and third power wirings M1_R2 and M1_R3. The double height cell DHC may be adjacent to the first and second single height cells SHC1 and SHC2 in a second direction D2.

A separation structure DB may be provided between the first single height cell SHC1 and the double height cell DHC and between the second single height cell SHC2 and the double height cell DHC. An active region of the double height cell DHC may be electrically separated from an active region of each of the first and second single height cells SHC1 and SHC2 by the separation structure DB.

Figure 4:
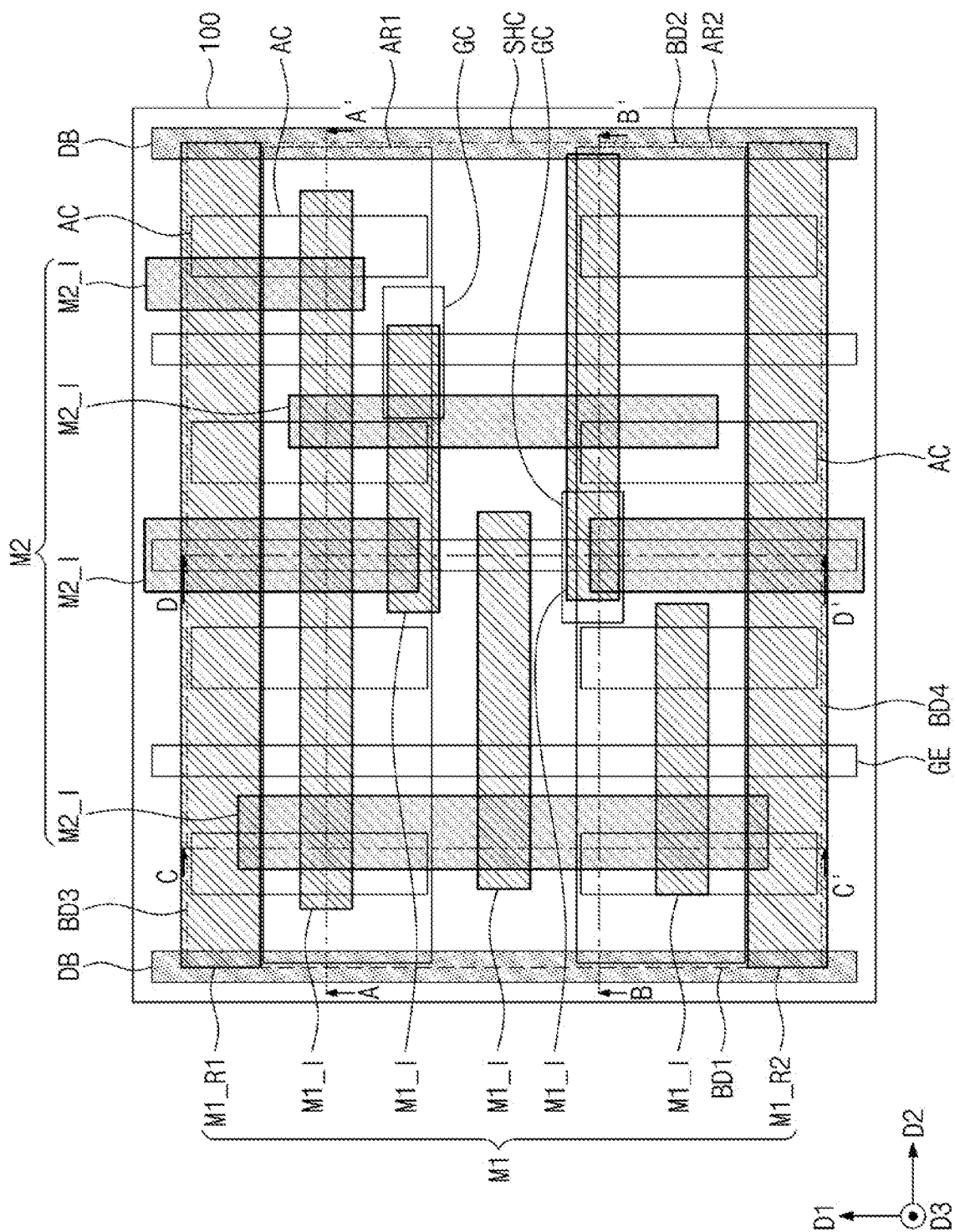
FIG. 4 is a plan view for illustrating a semiconductor device according to some example embodiments of the inventive concepts.
Figure 5A:
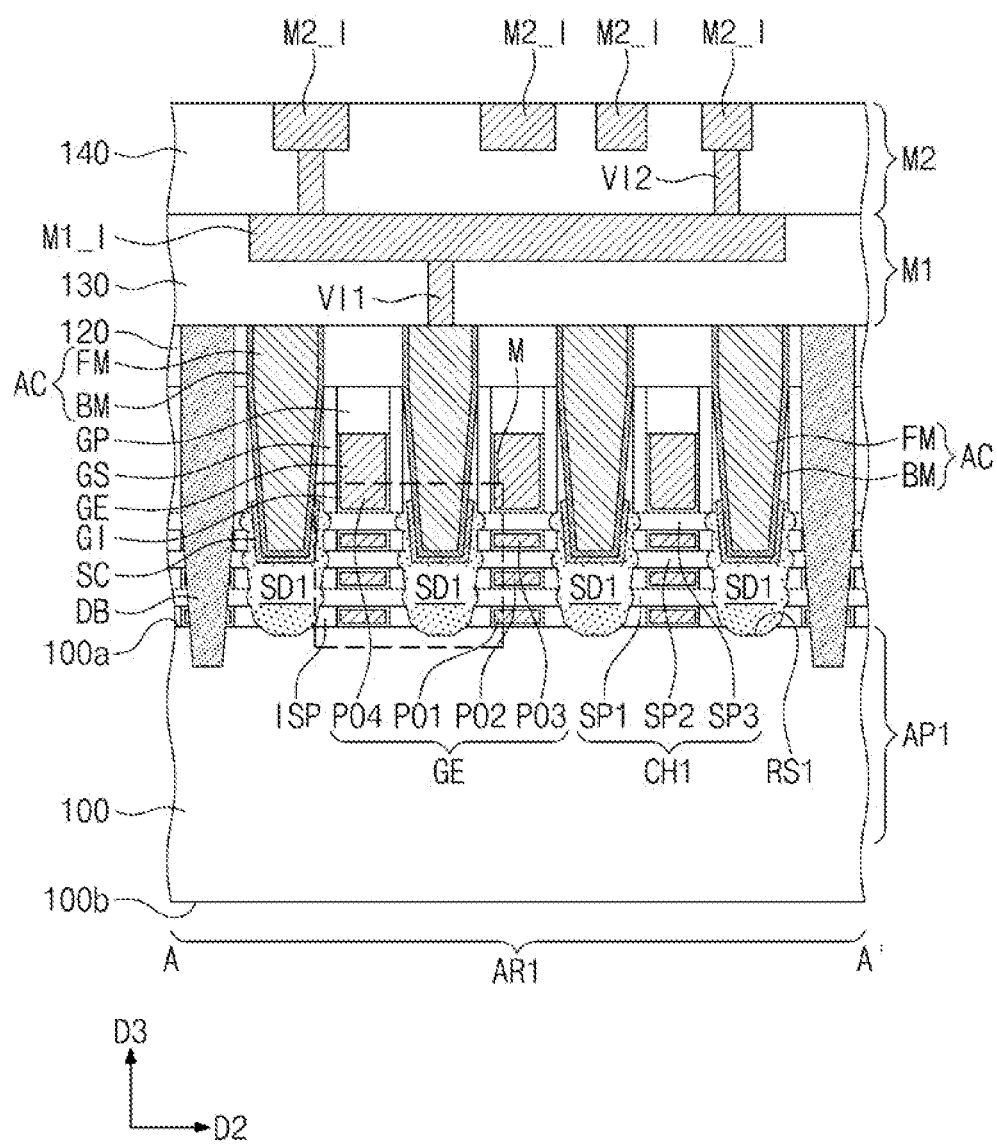
FIGS. 5A, 5B, 5C, and 5D are cross-sectional views taken along line A-A', line B-B', line C-C', and line D-D' of FIG. 4, respectively.
Figure 5B:
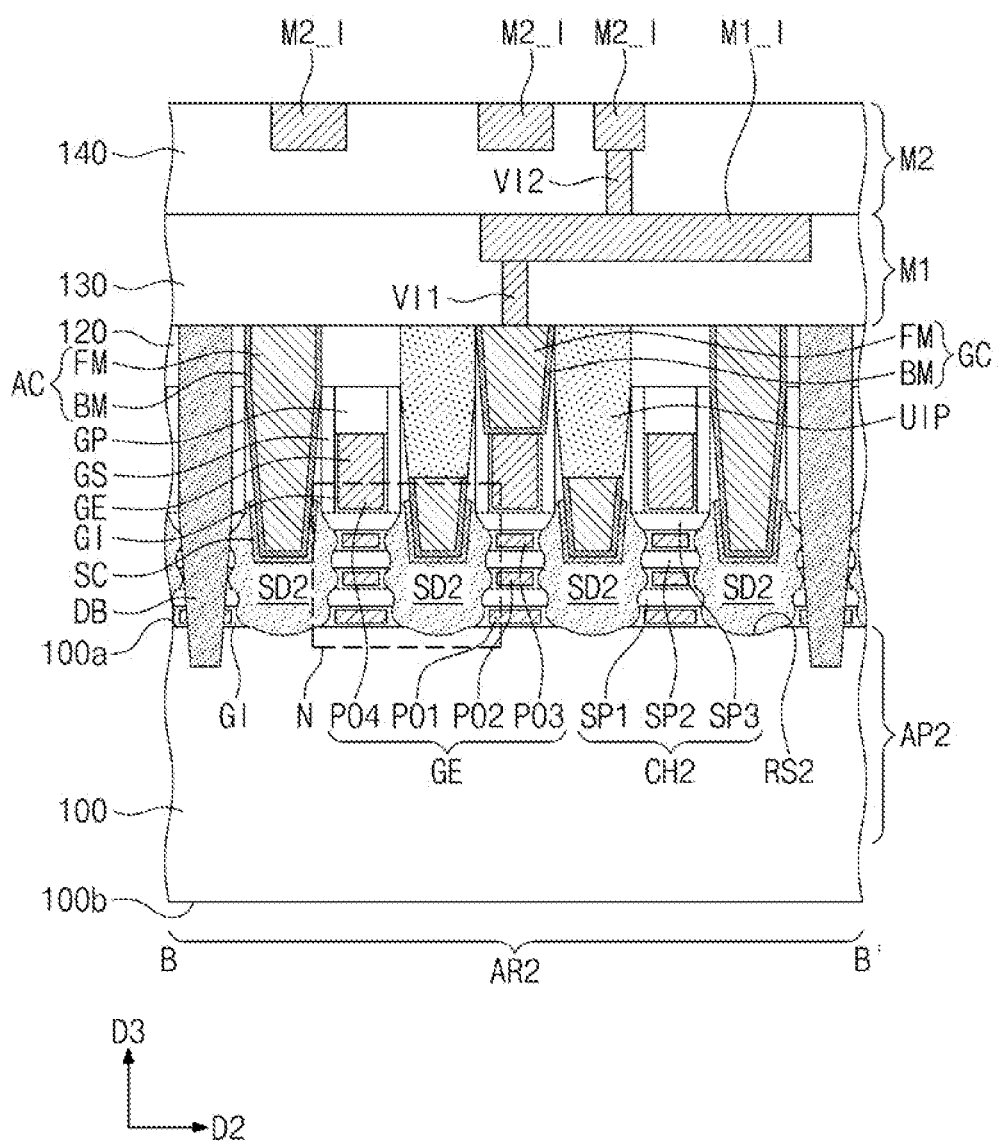
Figure 5C:
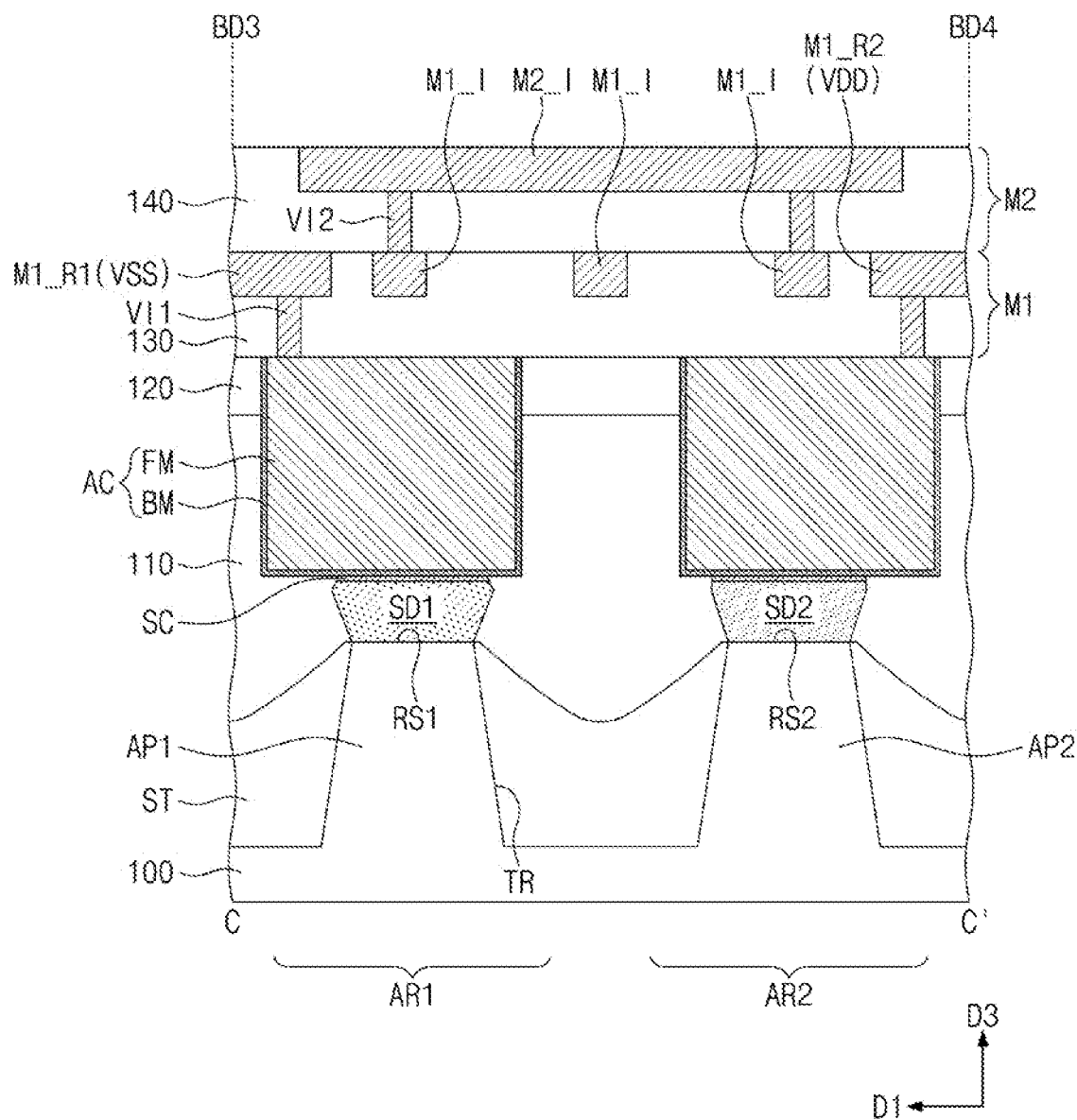

FIG. 4 is a plan view for illustrating a semiconductor device according to some example embodiments of the inventive concepts. FIGS. 5A, 5B, 5C, and 5D are cross-sectional views taken along line A-A', line B-B', line C-C, and line D-D' of FIG. 4, respectively. FIG. 6A is an enlarged view illustrating some example embodiments of region "M" of FIG. 5A. FIG. 6B is an enlarged view illustrating some example embodiments of region "N" of FIG. 5B. The semiconductor device illustrated in FIGS. 4 and 5A to 5D is an example of the single height cell SHC of FIG. 1 in more detail.

Referring to FIGS. 4 and 5A to 5D, a single height cell SHC may be provided on a substrate 100. Logic transistors constituting a logic circuit may be disposed on the single height cell SHC. The substrate 100 may be a semiconductor substrate including silicon, germanium, silicon-germanium, or the like, or a compound semiconductor substrate. For example, the substrate 100 may be a silicon substrate.

The substrate 100 may include a first active region AR1 and a second active region AR2. Each of the first and second active regions AR1 and AR2 may extend in a second direction D2. In some example embodiments, the first active region AR1 may be an NMOSFET region, and the second active region AR2 may be a PMOSFET region.

A first active pattern AP1 and a second active pattern AP2 may be defined by a trench TR formed on the substrate 100. The first active pattern AP1 may be provided on the first active region AR1, and the second active pattern AP2 may be provided on the second active region AR2. The first and second active patterns AP1 and AP2 may extend in the second direction D2. The first and second active patterns AP1 and AP2 may be a part of the substrate 100 and may be vertically protruding portions.

A device isolation layer ST may be provided on the substrate 100. The device isolation layer ST may fill the trench TR. The device isolation layer ST may include a silicon oxide layer. The device isolation layer ST may not cover first and second channel patterns CH1 and CH2 to be described later.

A first channel pattern CH1 may be provided on the first active pattern AP1. A second channel pattern CH2 may be provided on the second active pattern AP2. Each of the first channel pattern CH1 and the second channel pattern CH2 may include a first semiconductor pattern SP1, a second semiconductor pattern SP2, and a third semiconductor pattern SP3 sequentially stacked. The first to third semiconductor patterns SP1, SP2, and SP3 may be spaced apart from one another in a vertical direction (i.e., a third direction D3) which may be a direction extending perpendicular to the substrate 100, including for example extending perpendicular to the upper surface 100a and/or the bottom surface 100b of the substrate. As described herein, the first and second directions D1 and D2 may each be referred to as a horizontal direction extending in parallel with the substrate 100, including for example extending in parallel with the upper surface 100a and/or the bottom surface 100b of the substrate. The first and second directions D1 and D2 may be referred to as different, for example first and second horizontal directions extending perpendicular to each other. The third direction D3 may be referred to as a vertical direction extending perpendicular to the first and/or second directions D1 and/or D2.

Each of the first to third semiconductor patterns SP1, SP2, and SP3 may include silicon (Si), germanium (Ge), or silicon-germanium (SiGe). For example, each of the first to third semiconductor patterns SP1, SP2, and SP3 may include crystalline silicon.

A plurality of first source/drain patterns SD1 may be provided on the first active pattern AP1. A plurality of first recesses RS1 may be formed on the first active pattern AP1. The first source/drain patterns SD1 may be respectively provided in the first recesses RS1. The first source/drain patterns SD1 may be impurity regions of a first conductivity type (e.g., n-type). The first channel pattern CH1 may be interposed between a pair of first source/drain patterns SD1. That is, the stacked first to third semiconductor patterns SP1, SP2, and SP3 may connect the pair of first source/drain patterns SD1 to each other.

A plurality of second source/drain patterns SD2 may be provided on the second active pattern AP2. A plurality of second recesses RS2 may be formed on the second active pattern AP2. The second source/drain patterns SD2 may be respectively provided in the second recesses RS2. The second source/drain patterns SD2 may be impurity regions of a second conductivity type (e.g., p-type). The second channel pattern CH2 may be interposed between the pair of second source/drain patterns SD2. That is, the stacked first to third semiconductor patterns SP1, SP2, and SP3 may connect the pair of second source/drain patterns SD2 to each other.

The first and second source/drain patterns SD1 and SD2 may be epitaxial patterns formed by a selective epitaxial growth (SEG) process. For example, a top surface of each of the first and second source/drain patterns SD1 and SD2 may be higher than a top surface of the third semiconductor pattern SP3. As another example, the top surface of at least one of the first and second source/drain patterns SD1 and SD2 may be positioned at substantially the same level as the top surface of the third semiconductor pattern SP3.

In some example embodiments of the inventive concepts, the first source/drain patterns SD1 may include the same semiconductor element (e.g., Si) as the substrate 100. The second source/drain patterns SD2 may include a semiconductor element (e.g., SiGe) having a lattice constant greater than a lattice constant of the semiconductor element of the substrate 100. Accordingly, the pair of second source/drain patterns SD2 may provide a compressive stress to the second channel pattern CH2 therebetween.

A sidewall of each of the first and second source/drain patterns SD1 and SD2 may have a rough embossing form. That is, the sidewall of each of the first and second source/drain patterns SD1 and SD2 may have a wavy profile. In some example embodiments of the inventive concepts, the sidewall of the first source/drain pattern SD1 may protrude toward the first to third semiconductor patterns SP1, SP2, and SP3 of the first channel pattern CH1. The sidewall of the second source/drain pattern SD2 may protrude toward first to third portions PO1, PO2, and PO3 of a gate electrode GE, which will be described later.

Gate electrodes GE crossing the first and second channel patterns CH1 and CH2 and extending in a first direction D1 may be provided. The gate electrodes GE may be arranged in the second direction D2 by a first pitch. Each of the gate electrodes GE may vertically overlap the first and second channel patterns CH1 and CH2 and thus may extend from the first channel pattern CH1 to the second channel pattern CH2.

The gate electrode GE may include a first portion PO1 interposed between the active pattern AP1 or AP2 and the first semiconductor pattern SP1, a second portion PO2 interposed between the first semiconductor pattern SP1 and the second semiconductor pattern SP2, a third portion PO3 interposed between the second semiconductor pattern SP2 and the third semiconductor pattern SP3, and a fourth portion PO4 on the third semiconductor pattern SP3.

Figure 5D:
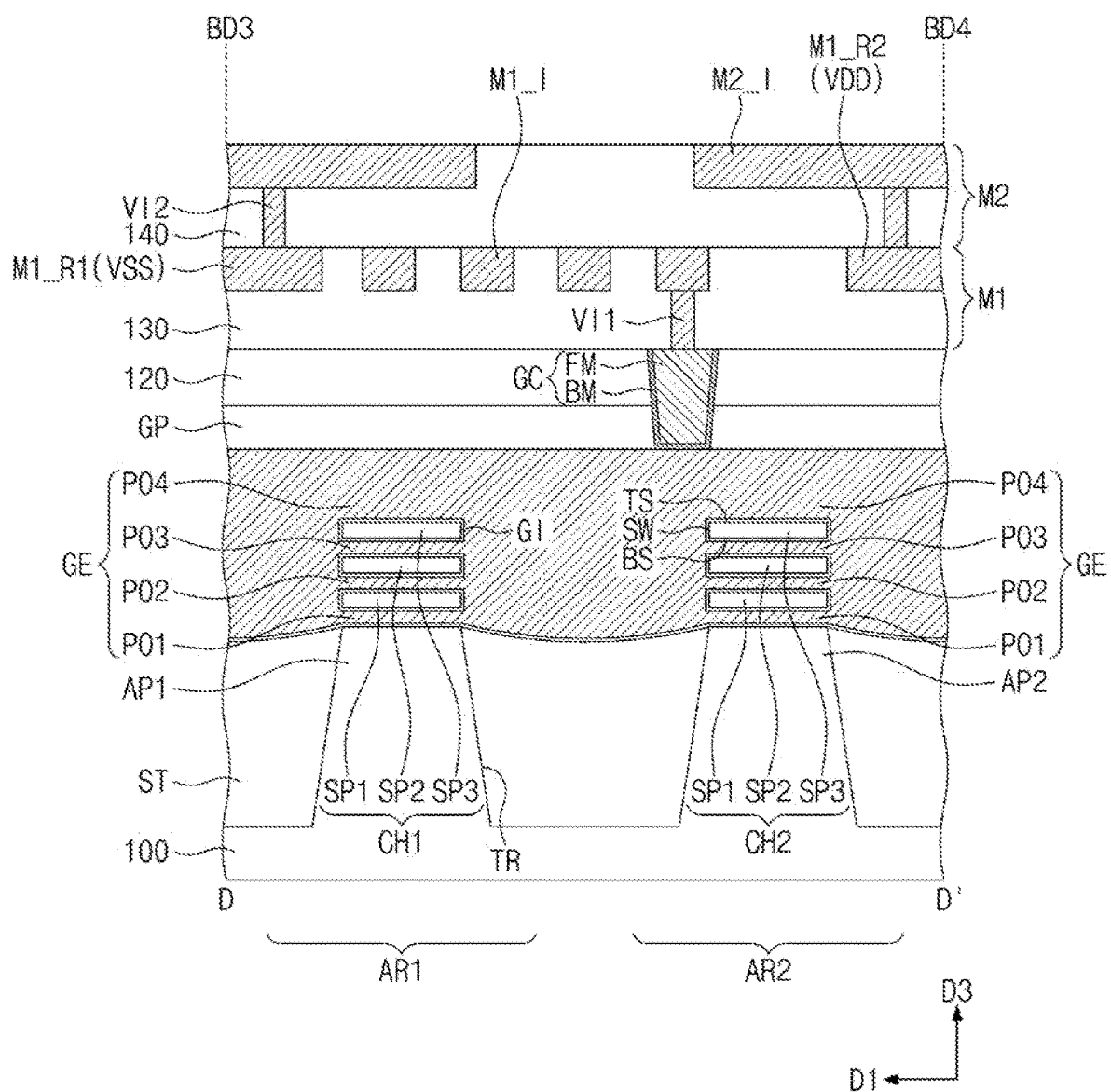
Figure 6A:
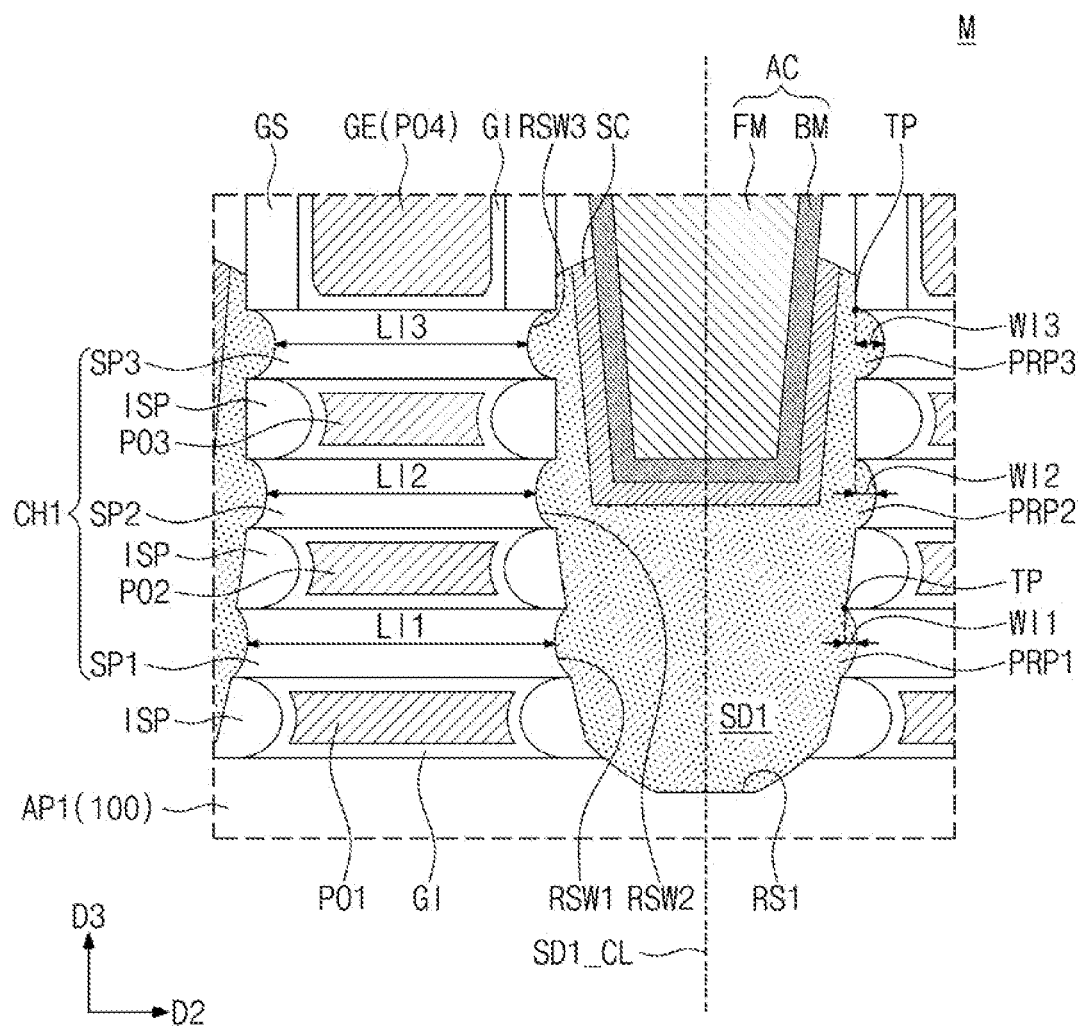
FIG. 6A is an enlarged view illustrating some example embodiments of region "M" of FIG. 5A.
Figure 6B:
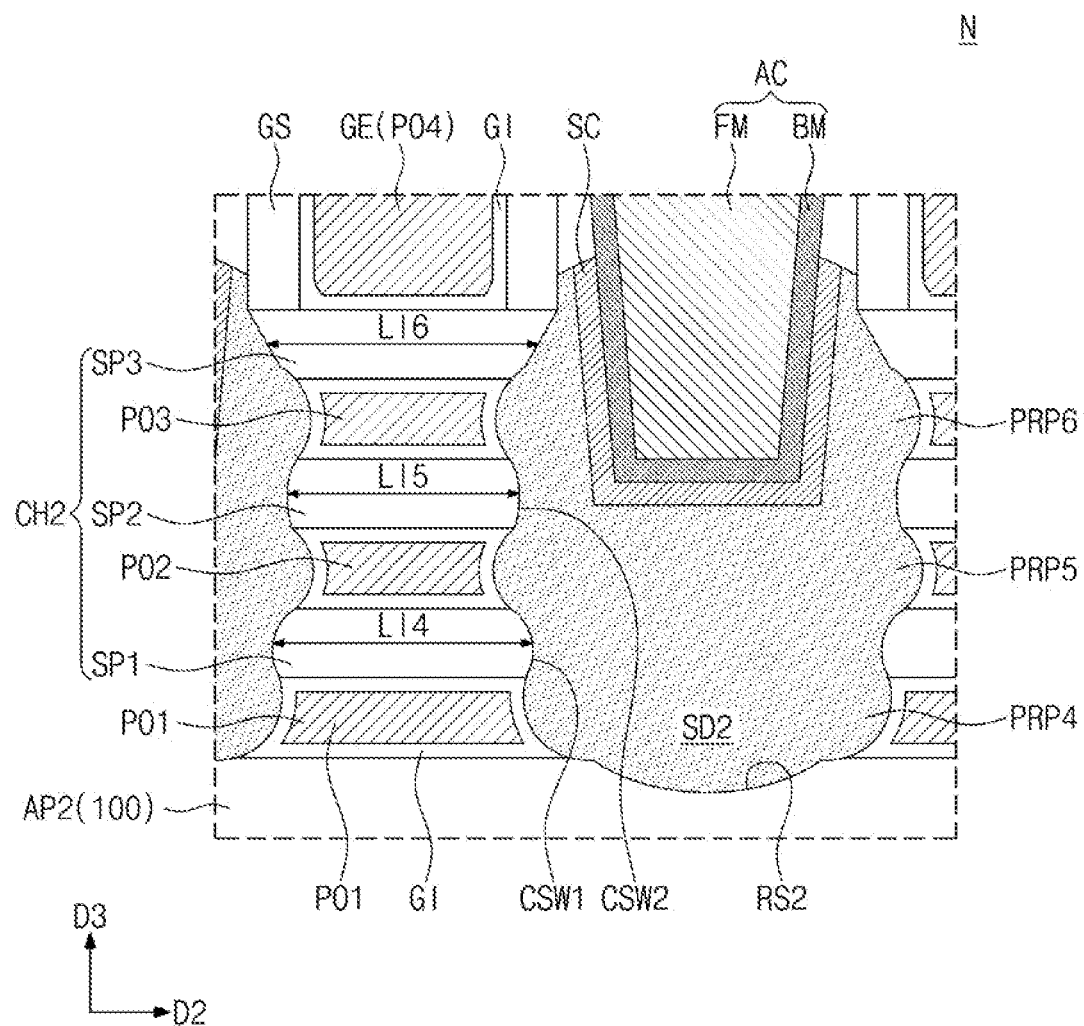
FIG. 6B is an enlarged view illustrating some example embodiments of region "N" of FIG. 5B.

Referring to FIG. 5D, the gate electrode GE may be provided on a top surface TS, a bottom surface BS, and both sidewalls SW of each of the first to third semiconductor patterns SP1, SP2, and SP3. That is, a transistor according to some example embodiments may be a three-dimensional field effect transistor (e.g., MBCFET or GAAFET) in which the gate electrode GE surrounds the channel three-dimensionally.

Inner spacers ISP may be interposed between the first to third portions PO1, PO2, and PO3 of the gate electrode GE and the first source/drain pattern SD1, respectively. Each of the first to third portions PO1, PO2, and PO3 of the gate electrode GE may be spaced apart from the first source/drain pattern SD1 with the inner spacer ISP interposed therebetween. The inner spacer ISP may reduce or prevent leakage current from the gate electrode GE. For example, the inner spacer ISP may include at least one of silicon oxide, silicon oxynitride, and silicon nitride.

Referring back to FIGS. 4 and 5A to 5D, a pair of gate spacers GS may be respectively disposed on both sidewalls of the fourth portion PO4 of the gate electrode GE. The gate spacers GS may extend in the first direction D1 along the gate electrode GE. Top surfaces of the gate spacers GS may be higher than top surfaces of the gate electrode GE. The top surfaces of the gate spacers GS may be coplanar with a top surface of a first interlayer insulating layer 110 to be described later. In some example embodiments, the gate spacers GS may include at least one of SiCN, SiCON, and SiN. In some example embodiments, the gate spacers GS may include a multi-layer including at least two of SiCN, SiCON, and SiN.

A gate capping pattern GP may be provided on the gate electrode GE. The gate capping pattern GP may extend in the first direction D1 along the gate electrode GE. The gate capping pattern GP may include a material having etch selectivity with respect to first and second interlayer insulating layers 110 and 120 to be described later. In detail, the gate capping pattern GP may include at least one of SiON, SiCN, SiCON, and SiN.

A gate insulating layer GI may be interposed between the gate electrode GE and the first channel pattern CH1 and between the gate electrode GE and the second channel pattern CH2. The gate insulating layer GI may cover the top surface TS, the bottom surface BS, and both sidewalls SW of each of the first to third semiconductor patterns SP1, SP2, and SP3. The gate insulating layer GI may cover a top surface of the device isolation layer ST under the gate electrode GE.

In some example embodiments of the inventive concepts, the gate insulating layer GI may include a silicon oxide layer, a silicon oxynitride layer, and/or a high dielectric layer. For example, the gate insulating layer GI may have a structure in which a silicon oxide layer and a high dielectric layer are stacked. The high dielectric layer may include a high dielectric material having a higher dielectric constant than a dielectric constant of a silicon oxide layer. For example, the high dielectric material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

In some example embodiments, the semiconductor device of the inventive concepts may include a negative capacitance (NC) FET using a negative capacitor. For example, the gate insulating layer GI may include a ferroelectric material layer having ferroelectric properties and a paraelectric material layer having paraelectric properties.

The ferroelectric material layer may have a negative capacitance, and the paraelectric material layer may have a positive capacitance. For example, when two or more capacitors are connected in series and a capacitance of each capacitor has a positive value, the total capacitance is decreased than a capacitance of each individual capacitor. On the other hand, when at least one of the capacitances of two or more capacitors connected in series has a negative value, the total capacitance may have a positive value and be greater than an absolute value of each individual capacitance.

When a ferroelectric material layer having a negative capacitance and a paraelectric material layer having a positive capacitance are connected in series, the total capacitance of the ferroelectric material layer and the paraelectric material layer connected in series may increase. By using the increase in the total capacitance value, the transistor including the ferroelectric material layer may have a subthreshold swing (SS) of less than 60 mV/decade at room temperature.

The ferroelectric material layer may have ferroelectric properties. The ferroelectric material layer may include, for example, at least one of hafnium oxide, hafnium zirconium oxide, barium strontium titanium oxide, barium titanium oxide, and lead zirconium titanium oxide. Here, as an example, hafnium zirconium oxide may be a material in which hafnium oxide is doped with zirconium (Zr). As another example, hafnium zirconium oxide may be a compound of hafnium (Hf), zirconium (Zr), and oxygen (O).

The ferroelectric material layer may further include a doped dopant. For example, dopants may include at least one of aluminum (Al), titanium (Ti), niobium (Nb), lanthanum (La), yttrium (Y), magnesium (Mg), silicon (Si), calcium (Ca), cerium (Ce)), dysprosium (Dy), erbium (Er), gadolinium (Gd), germanium (Ge), scandium (Sc), strontium (Sr), and tin (Sn). A type of dopant included in the ferroelectric material layer may vary depending on which ferroelectric material the ferroelectric material layer includes.

When the ferroelectric material layer includes hafnium oxide, the dopant included in the ferroelectric material layer may include, for example, at least one of gadolinium (Gd), silicon (Si), zirconium (Zr), aluminum (Al), and yttrium (Y).

When the dopant is aluminum (Al), the ferroelectric material layer may include 3 to 8 atomic % (at %) of aluminum. Here, a ratio of the dopant may be a ratio of aluminum to the sum of hafnium and aluminum.

When the dopant is silicon (Si), the ferroelectric material layer may include 2 to 10 at % of silicon. When the dopant is yttrium (Y), the ferroelectric material layer may include 2 to 10 at % of yttrium. When the dopant is gadolinium (Gd), the ferroelectric material layer may include 1 to 7 at % gadolinium. When the dopant is zirconium (Zr), the ferroelectric material layer may include 50 to 80 at % of zirconium.

The paraelectric material layer may have paraelectric properties. The paraelectric material layer may include, for example, at least one of silicon oxide and a metal oxide having a high dielectric constant. The metal oxide included in the paraelectric material layer may include, for example, at least one of hafnium oxide, zirconium oxide, and aluminum oxide, but is not limited thereto.

The ferroelectric material layer and the paraelectric material layer may include the same material. The ferroelectric material layer may have ferroelectric properties, but the paraelectric material layer may not have ferroelectric properties. For example, when the ferroelectric material layer and the paraelectric material layer include hafnium oxide, a crystal structure of hafnium oxide included in the ferroelectric material layer is different from a crystal structure of hafnium oxide included in the paraelectric material layer.

The ferroelectric material layer may have a thickness having ferroelectric properties. The thickness of the ferroelectric material layer may be, for example, 0.5 to 10 nm, but is not limited thereto. A critical thickness representing the ferroelectric properties may vary for each ferroelectric material, the thickness of the ferroelectric material layer may vary depending on the ferroelectric material.

For example, the gate insulating layer GI may include one ferroelectric material layer. As another example, the gate insulating layer GI may include a plurality of ferroelectric material layers spaced apart from one another. The gate insulating layer GI may have a stacked structure in which a plurality of ferroelectric material layers and a plurality of paraelectric material layers are alternately stacked.

Referring back to FIGS. 4 and 5A to 5D, the gate electrode GE may include a first metal pattern and a second metal pattern on the first metal pattern. The first metal pattern may be provided on the gate insulating layer GI and may be adjacent to the first to third semiconductor patterns SP1, SP2, and SP3. The first metal pattern may include a work function metal that adjusts a threshold voltage of the transistor. A desired threshold voltage of the transistor may be achieved by adjusting a thickness and composition of the first metal pattern. For example, the first to third portions PO1, PO2, and PO3 of the gate electrode GE may be formed of the first metal pattern that is a work function metal.

The first metal pattern may include a metal nitride layer. For example, the first metal pattern may include at least one metal selected from the group consisting of titanium (Ti), tantalum (Ta), aluminum (Al), tungsten (W), and molybdenum (Mo), and nitrogen (N). Furthermore, the first metal pattern may further include carbon (C). The first metal pattern may include a plurality of stacked work function metal layers.

The second metal pattern may include a metal having a lower resistance than a resistance of the first metal pattern. For example, the second metal pattern may include at least one metal selected from the group consisting of tungsten (W), aluminum (Al), titanium (Ti), and tantalum (Ta). For example, the fourth portion PO4 of the gate electrode GE may include the first metal pattern and the second metal pattern on the first metal pattern.

A first interlayer insulating layer 110 may be provided on the substrate 100. The first interlayer insulating layer 110 may cover the gate spacers GS and the first and second source/drain patterns SD1 and SD2. A top surface of the first interlayer insulating layer 110 may be substantially coplanar with a top surface of the gate capping pattern GP and a top surface of the gate spacer GS. A second interlayer insulating layer 120 covering the gate capping pattern GP may be disposed on the first interlayer insulating layer 110. A third interlayer insulating layer 130 may be provided on the second interlayer insulating layer 120. A fourth interlayer insulating layer 140 may be provided on the third interlayer insulating layer 130. For example, the first to fourth interlayer insulating layers 110 to 140 may include a silicon oxide layer.

The single height cell SHC may have a first boundary BD1 and a second boundary BD2 opposite to each other in the second direction D2. The first and second boundaries BD1 and BD2 may extend in the first direction D1. The single height cell SHC may have a third boundary BD3 and a fourth boundary BD4 opposite to each other in the first direction D1. The third and fourth boundaries BD3 and BD4 may extend in the second direction D2.

A pair of separation structures DB opposite to each other in the second direction D2 may be provided on both sides of the single height cell SHC. For example, the pair of separation structures DB may be provided on the first and second boundaries BD1 and BD2 of the single height cell SHC, respectively. The separation structure DB may extend parallel to the gate electrodes GE in the first direction D1. A pitch between the separation structure DB and the gate electrode GE adjacent thereto may be the same as the first pitch.

The separation structure DB may pass through the first and second interlayer insulating layers 110 and 120 and extend into the first and second active patterns AP1 and AP2. The separation structure DB may pass through each of the first and second active patterns AP1 and AP2. The separation structure DB may electrically isolate an active region of the single height cell SHC from an active region of another adjacent cell.

Active contacts AC may be provided through the first and second interlayer insulating layers 110 and 120 and electrically connected to the first and second source/drain patterns SD1 and SD2, respectively. A pair of active contacts AC may be provided on both sides of the gate electrode GE, respectively. In a plan view, the active contact AC may have a bar shape extending in the first direction D1.

The active contact AC may be a self-aligned contact. That is, the active contact AC may be formed in a self-aligned manner using the gate capping pattern GP and the gate spacer GS. For example, the active contact AC may cover at least a part of a sidewall of the gate spacer GS. Although not shown, the active contact AC may partially cover the top surface of the gate capping pattern GP.

A metal-semiconductor compound layer SC, such as a silicide layer, may be respectively interposed between the active contact AC and the first source/drain pattern SD1 and between the active contact AC and the second source/drain pattern SD2, respectively. The active contact AC may be electrically connected to the source/drain patterns SD1 and SD2 through the metal-semiconductor compound layer SC. For example, the metal-semiconductor compound layer SC may include at least one of titanium-silicide, tantalum-silicide, tungsten-silicide, nickel-silicide, and cobalt-silicide.

Gate contacts GC may be provided through the second interlayer insulating layer 120 and the gate capping pattern GP to be electrically connected to the gate electrodes GE, respectively. In a plan view, the gate contacts GC may be disposed to overlap the first active region AR1 and the second active region AR2, respectively. For example, the gate contact GC may be provided on the second active pattern AP2 (refer to FIG. 5B).

In some example embodiments of the inventive concepts, referring to FIG. 5B, an upper portion of the active contact AC adjacent to the gate contact GC may be filled with an upper insulating pattern UIP. A bottom surface of the upper insulating pattern UIP may be lower than a bottom surface of the gate contact GC. That is, a top surface of the active contact AC adjacent to the gate contact GC may descend lower than a bottom surface of the gate contact GC by the upper insulating pattern UIP. Accordingly, a problem in that the gate contact GC comes into contact with the active contact AC adjacent thereto and a short circuit occurs may be reduced or prevented.

Each of the active contact AC and the gate contact GC may include a conductive pattern FM and a barrier pattern BM surrounding the conductive pattern FM. For example, the conductive pattern FM may include at least one of aluminum, copper, tungsten, molybdenum, and cobalt. The barrier pattern BM may cover sidewalls and a bottom surface of the conductive pattern FM. The barrier pattern BM may include a metal layer/metal nitride layer. The metal layer may include at least one of titanium, tantalum, tungsten, nickel, cobalt, and platinum. The metal nitride layer may include at least one of a titanium nitride layer (TiN), a tantalum nitride layer (TaN), a tungsten nitride layer (WN), a nickel nitride layer (NiN), a cobalt nitride layer (CoN), and a platinum nitride layer (PtN).

A first metal layer M1 may be provided in the third interlayer insulating layer 130. For example, the first metal layer M1 may include a first power wiring M1_R1, a second power wiring M1_R2, and first wirings M1_I. Each of the wirings M1_R1, M1_R2, and M1_I of the first metal layer M1 may extend parallel to one another in the second direction D2.

In detail, the first and second power wirings M1_R1 and M1_R2 may be provided on the third and fourth boundaries BD3 and BD4 of the single height cell SHC, respectively. The first power wiring M1_R1 may extend in the second direction D2 along the third boundary BD3. The second power wiring M1_R2 may extend in the second direction D2 along the fourth boundary BD4.

The first wirings M1_I of the first metal layer M1 may be disposed between the first and second power wirings M1_R1 and M1_R2. The first wirings M1_I of the first metal layer M1 may be arranged in the first direction D1 at a second pitch. The second pitch may be smaller than the first pitch. A critical dimension of each of the first wirings M1_I may be smaller than a critical dimension of each of the first and second power wirings M1_R1 and M1_R2.

The first metal layer M1 may further include first vias VI1. The first vias VI1 may be respectively provided under the wirings M1_R1, M1_R2, and M1_I of the first metal layer M1. The active contact AC and the wiring of the first metal layer M1 may be electrically connected to each other through the first via VI1. The gate contact GC and the wiring of the first metal layer M1 may be electrically connected to each other through the first via VI1.

The wiring of the first metal layer M1 and the first via VI1 under the wiring of the first metal layer M1 may be formed through separate processes. That is, each of the wiring and the first via VI1 of the first metal layer M1 may be formed by a single damascene process. The semiconductor device according to some example embodiments may be formed using a process of less than 20 nm.

A second metal layer M2 may be provided in the fourth interlayer insulating layer 140. The second metal layer M2 may include a plurality of second wirings M2_I. Each of the second wirings M2_1 of the second metal layer M2 may have a line shape or a bar shape extending in the first direction D1. That is, the second wirings M2_1 may extend parallel to one another in the first direction D1.

The second metal layer M2 may further include second vias VI2 respectively provided under the second wirings M2_I. The wiring of the first metal layer M1 and the wiring of the second metal layer M2 may be electrically connected to each other through the second via VI2. For example, the wiring of the second metal layer M2 and the second via VI2 under the wiring of the second metal layer M2 may be formed together by a dual damascene process.

The wiring of the first metal layer M1 and the wiring of the second metal layer M2 may include the same or different conductive materials. For example, the wiring of the first metal layer M1 and the wiring of the second metal layer M2 may include at least one metal material selected from aluminum, copper, tungsten, molybdenum, ruthenium, and cobalt. Although not shown, metal layers (e.g., M3, M4, M5 . . . ) stacked on the fourth interlayer insulating layer 140 may be additionally disposed. Each of the stacked metal layers may include wirings for routing between cells.

The first channel pattern CH1 and the first source/drain pattern SD1 will be described in more detail with reference to FIG. 6A. Referring to FIG. 6A, the first source/drain pattern SD1 may include first, second, and third protrusions PRP1, PRP2, and PRP3. The first to third protrusions PRP1, PRP2, and PRP3 may protrude toward the first, second, and third semiconductor patterns SP1, SP2, and SP3 of the first channel pattern CH1, respectively, for example protruding in the second direction D2 (e.g., a horizontal direction) and away from a centerline SD1_CL of the first source/drain pattern SD1 extending in the third direction D3 as shown in at least FIG. 6A.

A sidewall of each of the first, second, and third protrusions PRP1, PRP2, and PRP3 may have a convex profile. The first protrusion PRP1 may be in contact with the first semiconductor pattern SP1, directly. A sidewall of the first semiconductor pattern SP1 may have a first concave sidewall RSW1 corresponding to the convex sidewall of the first protrusion PRP1. The second protrusion PRP2 may be in contact with the second semiconductor pattern SP2, directly. A sidewall of the second semiconductor pattern SP2 may have a second concave sidewall RSW2 corresponding to the convex sidewall of the second protrusion PRP2. The third protrusion PRP3 may be in contact with the third semiconductor pattern SP3, directly. A sidewall of the third semiconductor pattern SP3 may have a third concave sidewall RSW3 corresponding to the convex sidewall of the third protrusion PRP3.

The first, second, and third protrusions PRP1, PRP2, and PRP3 may have different widths in the second direction D2. In detail, the first protrusion PRP1 may have a first width WI1 in the second direction D2. The first width WI1 of the first protrusion PRP1 may be defined as a distance, for example a distance in the second direction D2, from a tip TP of the first semiconductor pattern SP1, which may be a portion of the first semiconductor pattern SP1 that is closest, or proximate, to the centerline SD1_CL of the first source/drain pattern SD1 in the second direction D2 in relation to immediately adjacent portions of the first semiconductor pattern SP1 as shown in FIG. 6A, to the sidewall of the first protrusion PRP1, which may be a portion of a sidewall of the first protrusion PRP1 that is furthest, or distal, from the centerline SD1_CL of the first source/drain pattern SD1 in the second direction D2, for example as shown in FIG. 6A. The second protrusion PRP2 may have a second width WI2 in the second direction D2, and the third protrusion PRP3 may have a third width WI3 in the second direction D2. The second width WI2 of the second protrusion PRP2 may be defined as a distance, for example a distance in the second direction D2, from a tip TP of the second semiconductor pattern SP2, which may be a portion of the second semiconductor pattern SP2 that is closest, or proximate, to the centerline SD1_CL of the first source/drain pattern SD1 in the second direction D2 in relation to immediately adjacent portions of the second semiconductor pattern SP2 as shown in FIG. 6A, to the sidewall of the second protrusion PRP2, which may be a portion of a sidewall of the second protrusion PRP2 that is furthest, or distal, from the centerline SD1_CL of the first source/drain pattern SD1 in the second direction D2, for example as shown in FIG. 6A. The third width WI3 of the third protrusion PRP3 may be defined as a distance, for example a distance in the second direction D2, from a tip TP of the third semiconductor pattern SP3, which may be a portion of the third semiconductor pattern SP3 that is closest, or proximate, to the centerline SD1_CL of the first source/drain pattern SD1 in the second direction D2 in relation to immediately adjacent portions of the third semiconductor pattern SP3 as shown in FIG. 6A, to the sidewall of the third protrusion PRP3, which may be a portion of a sidewall of the third protrusion PRP3 that is furthest, or distal, from the centerline SD1_CL of the first source/drain pattern SD1 in the second direction D2, for example as shown in FIG. 6A. The second width WI2 may be greater than the first width WI1. The third width WI3 may be greater than the second width WI2. As described herein, based on the presences of the first to third protrusions PRP1 to PRP3 having the different widths WI1 to WI3 as described herein, the presence of voids and/or lattice defects in the first source/drain pattern SD1 may be reduced, minimized, or prevented, for example based on (as shown in at least FIG. 15) an epitaxial layer SEL being formed, as part of forming the first source/drain pattern SD1, to completely cover one or more inner spacers ISP without voids or with reduced voids using the first to third channel recesses CRS1, CRS2, and CRS3 of the first to third semiconductor patterns SP1 to SP3 in which the first to third protrusions PRP1 to PRP3 are formed having respective widths WI1 to WI3, thereby improving reliability and/or performance of the semiconductor device.

According to some example embodiments of the inventive concepts, the uppermost third protrusion PRP3 among the first, second, and third protrusions PRP1, PRP2, and PRP3 may most protrude horizontally. The lowermost first protrusion PRP1 among the first, second, and third protrusions PRP1, PRP2, and PRP3 may least protrude horizontally, for example in a horizontal direction D1 and/or D2, which may each be a direction extending in parallel with the substrate 100, for example in parallel with the upper surface 100a and/or the bottom surface 100b of the substrate 100.

The first to third concave sidewalls RSW1 to RSW3 may be horizontally recessed to different degrees. A recessed degree of the first concave sidewall RSW1 may be smaller than a recessed degree of the second concave sidewall RSW2. The recessed degree of the second concave sidewall RSW2 may be smaller than s recessed degree of the third concave sidewall RSW3. This is because the widths of the first to third protrusions PRP1 to PRP3 are different from one another.

The widths of the first, second, and third protrusions PRP1, PRP2, and PRP3 may be different from one another, and thus lengths (or widths) of the first to third semiconductor patterns SP1, SP2, and SP3 in the second direction D2 may also be different from one another. In detail, the first semiconductor pattern SP1 may have a first length LI1 in the second direction D2. The first length LI1 of the first semiconductor pattern SP1 may be defined as a width (e.g., in the second direction D2, which may be referred to herein as a horizontal direction) of a center of the first semiconductor pattern SP1. The first length LI1 of the first semiconductor pattern SP1 may be a minimum width of the first semiconductor pattern SP1. The second semiconductor pattern SP2 may have a second length LI2 in the second direction D2, and the third semiconductor pattern SP3 may have a third length LI3 in the second direction D2. The second length LI2 may be greater than the third length LI3. The first length LI1 may be greater than the second length LI2.

According to some example embodiments of the inventive concepts, the uppermost third semiconductor pattern SP3 among the first to third semiconductor patterns SP1, SP2, and SP3 may have the smallest channel length. The lowermost first semiconductor pattern SP1 among the first to third semiconductor patterns SP1, SP2, and SP3 may have the longest channel length.

The inner spacers ISP may be interposed between the first source/drain pattern SD1 and the first to third portions PO1, PO2, and PO3 of the gate electrode GE, respectively. Each of the inner spacers ISP may have a sidewall protruding toward the gate electrode GE. The inner spacer ISP may horizontally protrude larger than the first to third protrusions PRP1 to PRP3. That is, a width of the inner spacer ISP in the second direction D2 (e.g., a largest width of the inner spacer ISP in the second direction D2) may be greater than a width of each of the first to third protrusions PRP1, PRP2, and PRP3 (e.g., may be greater than each of the first to third widths WI1 to WI3). At least one inner spacer ISP may be between adjacent protrusions of the first to third protrusions PRP1 to PRP3 which are spaced apart (e.g., isolated from contact, where contact may be referred to herein interchangeably as direct contact) from each other in the third direction D3 (e.g., a vertical direction).

According to some example embodiments of the inventive concepts, the first source/drain pattern SD1 may include the first, second, and third protrusions PRP1, PRP2, and PRP3, thereby reducing or preventing formation of a void on the inner spacer ISP, for example based on the first, second, and third protrusions PRP1, PRP2, and PRP3 having different widths WI1, WI2, and WI3 in the second direction D2. As a result, the some example embodiments of the inventive concepts may provide the first source/drain pattern SD1 without voids and lattice defects or with reduced voids and lattice defects, and as a result, reliability and electrical characteristics of the device may be improved based on the first source/drain pattern SD1 including the first, second, and third protrusions PRP1, PRP2, and PRP3 having different widths WI1, WI2, and WI3 in the second direction D2.

The second channel pattern CH2 and the second source/drain pattern SD2 will be described in more detail with reference to FIG. 6B. Referring to FIG. 6B, the second source/drain pattern SD2 may include fourth, fifth, and sixth protrusions PRP4, PRP5, and PRP6. The fourth to sixth protrusions PRP4, PRP5, and PRP6 may protrude (e.g., in the second direction D2) toward the first, second, and third portions PO1, PO2, and PO3 of the gate electrode GE, respectively. Sidewalls of the first to third portions PO1, PO2, and PO3 of the gate electrode GE may be concave to correspond to the fourth to sixth protrusions PRP4, PRP5, and PRP6, respectively.

Unlike FIG. 6A, the inner spacer ISP may be omitted between the second source/drain pattern SD2 and the first to third portions PO1, PO2, and PO3 of the gate electrode GE. Accordingly, the fourth to sixth protrusions PRP4, PRP5, and PRP6 may be in contact with the gate insulating layer GI, directly.

The first semiconductor pattern SP1 of the second channel pattern CH2, which in some example embodiments may be referred to as a fourth semiconductor pattern, may have a first convex sidewall CSW1 protruding toward the second source/drain pattern SD2. The second semiconductor pattern SP2 of the second channel pattern CH2, which in some example embodiments may be referred to as a fifth semiconductor pattern, may have a second convex sidewall CSW2 protruding toward the second source/drain pattern SD2. In some example embodiments, the third semiconductor pattern SP3 of the second channel pattern CH2 may be referred to as a sixth semiconductor pattern. As shown, and similarly to the first to third semiconductor patterns SP1 to SP3 of the first channel pattern CH1, the first to third semiconductor patterns SP1 to SP3 (e.g., fourth to sixth semiconductor patterns) of the second channel pattern CH2 may be spaced apart from one another (e.g., in the third direction D3) and vertically stacked (e.g., in the third direction D3).

Lengths (or widths) of the first to third semiconductor patterns SP1, SP2, and SP3 of the second channel pattern CH2 in the second direction D2 may be different from one another. In detail, the first semiconductor pattern SP1 of the second channel pattern CH2 may have a fourth length LI4 in the second direction D2. The fourth length LI4 of the first semiconductor pattern SP1 may be defined as a width of a center of the first semiconductor pattern SP1. The fourth length LI4 of the first semiconductor pattern SP1 may be a maximum width of the first semiconductor pattern SP1. The second semiconductor pattern SP2 may have a fifth length LI5 in the second direction D2, and the third semiconductor pattern SP3 may have a sixth length LI6 in the second direction D2. The fourth length LI4 may be greater than the fifth length LI5. The sixth length LI6 may be greater than the fourth length LI4. That is, in the second channel pattern CH2 according to some example embodiments, the uppermost semiconductor pattern, that is, the third semiconductor pattern SP3 may have the longest channel length.

FIGS. 7A, 7B, 8A, 8B, 9A, 9B, 9C, 10A, 10B, 10C, 11A, 11B, 11C, 12A, 12B, and 12C are cross-sectional views for illustrating a method of manufacturing a semiconductor device according to some example embodiments of the inventive concepts. In detail, FIGS. 7A, 8A, 9A, 10A, 11A, and 12A are cross-sectional views corresponding to line A-A' of FIG. 4. FIGS. 9B and 10B are cross-sectional views corresponding to line B-B' of FIG. 4. FIGS. 9C, 10C, 11B, and 12B are cross-sectional views corresponding to line C-C of FIG. 4. FIGS. 7B, 8B, 11C and 12C are cross-sectional views corresponding to line D-D' of FIG. 4.

Figure 7A:
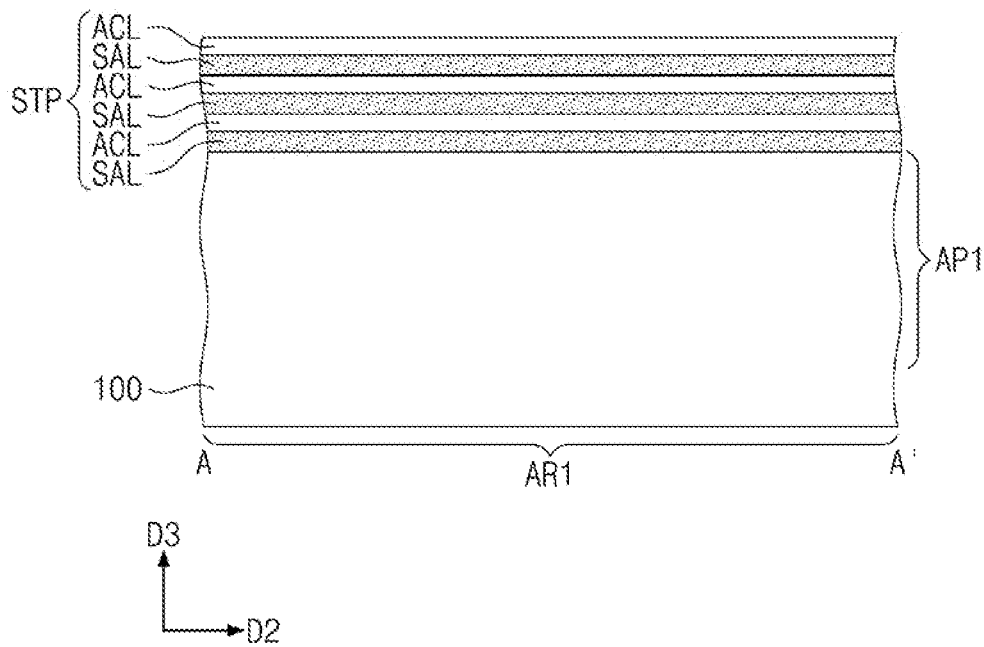
FIGS. 7A, 7B, 8A, 8B, 9A, 9B, 9C, 10A, 10B, 10C, 11A, 11B, 11C, 12A, 12B, and 12C are cross-sectional views for illustrating a method of manufacturing a semiconductor device according to some example embodiments of the inventive concepts.
Figure 7B:
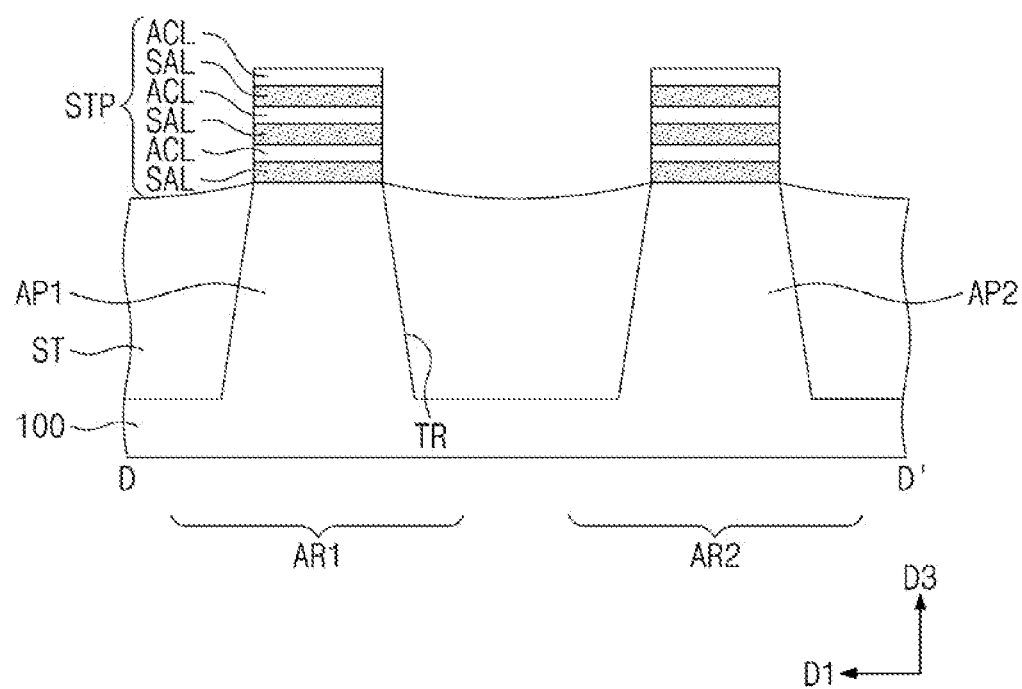

Referring to FIGS. 7A and 7B, a substrate 100 including first and second active regions AR1 and AR2 may be provided. Active layers ACL and sacrificial layers SAL may be alternately stacked on the substrate 100. The active layers ACL may include one of silicon (Si), germanium (Ge), and silicon-germanium (SiGe), and the sacrificial layers SAL may include another one of silicon (Si), germanium (Ge), and silicon-germanium (SiGe).

The sacrificial layer SAL may include a material having an etch selectivity with respect to the active layer ACL. For example, the active layers ACL may include silicon (Si), and the sacrificial layers SAL may include silicon-germanium (SiGe). A concentration of germanium (Ge) in each of the sacrificial layers SAL may be 10 at % to 30 at %.

Mask patterns may be respectively formed on the first and second active regions AR1 and AR2 of the substrate 100. The mask pattern may have a line shape or a bar shape extending in a second direction D2.

A patterning process may be performed using the mask patterns as an etch mask to from a trench TR defining a first active pattern AP1 and a second active pattern AP2. The first active pattern AP1 may be formed on the first active region AR1. The second active pattern AP2 may be formed on the second active region AR2.

A stacked pattern STP may be formed on each of the first and second active patterns AP1 and AP2. The stacked pattern STP may include active layers ACL and sacrificial layers SAL that are alternately stacked. The stacked pattern STP may be formed together with the first and second active patterns AP1 and AP2 during the patterning process.

A device isolation layer ST filling the trench TR may be formed. In detail, an insulating layer covering the first and second active patterns AP1 and AP2 and the stacked patterns STP may be formed on an entire surface of the substrate 100. The insulating layer may be recessed until the stacked patterns STP are exposed, to form the device isolation layer ST.

The device isolation layer ST may include an insulating material such as a silicon oxide layer. The stacked patterns STP may be exposed on the device isolation layer ST. That is, the stacked patterns STP may protrude vertically above the device isolation layer ST.

Figure 8A:
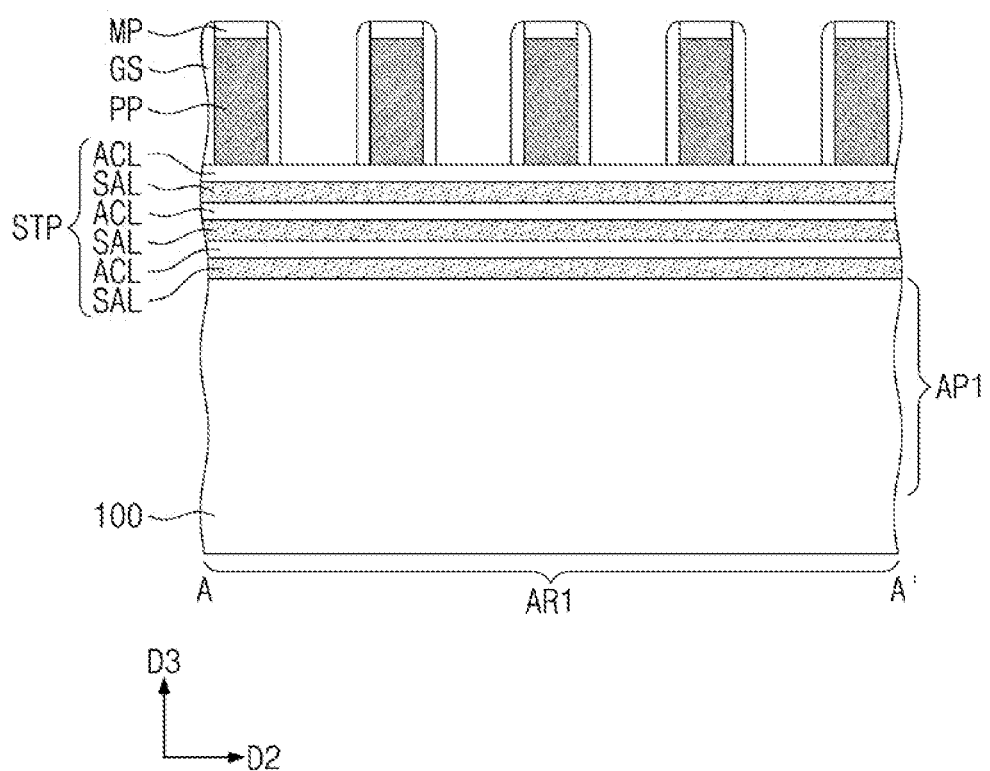
Figure 8B:
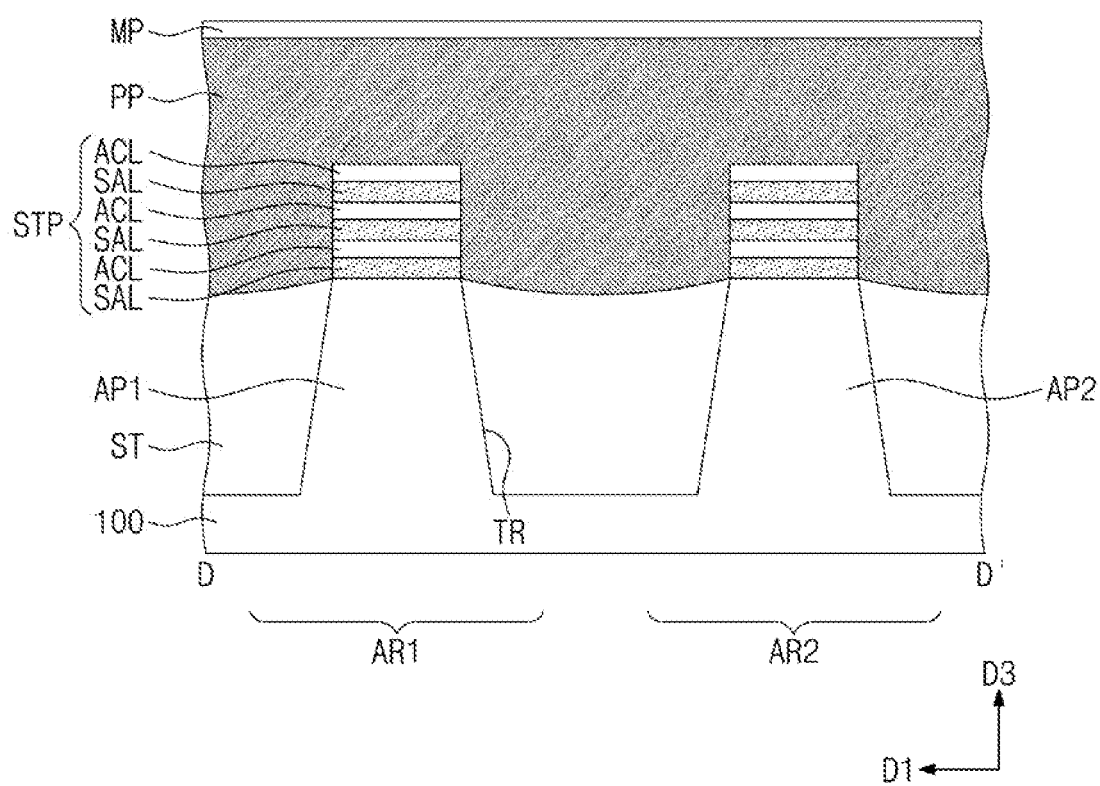

Referring to FIGS. 8A and 8B, sacrificial patterns PP crossing the stacked patterns STP may be formed on the substrate 100. Each of the sacrificial patterns PP may be formed in a line shape or a bar shape extending in a first direction D1. The sacrificial patterns PP may be arranged in the second direction D2 at a first pitch.

In detail, forming the sacrificial patterns PP may include forming a sacrificial layer on the entire surface of the substrate 100, forming hard mask patterns MP on the sacrificial layer, and patterning the sacrificial layer using the hard mask patterns MP as an etch mask. The sacrificial layer may include polysilicon.

A pair of gate spacers GS may be formed on both sidewalls of each of the sacrificial patterns PP. Forming the gate spacers GS may include conformally forming a gate spacer layer on the entire surface of the substrate 100 and anisotropically etching the gate spacer layer. In some example embodiments of the inventive concepts, the gate spacer GS may be a multi-layer including at least two layers.

Figure 9A:
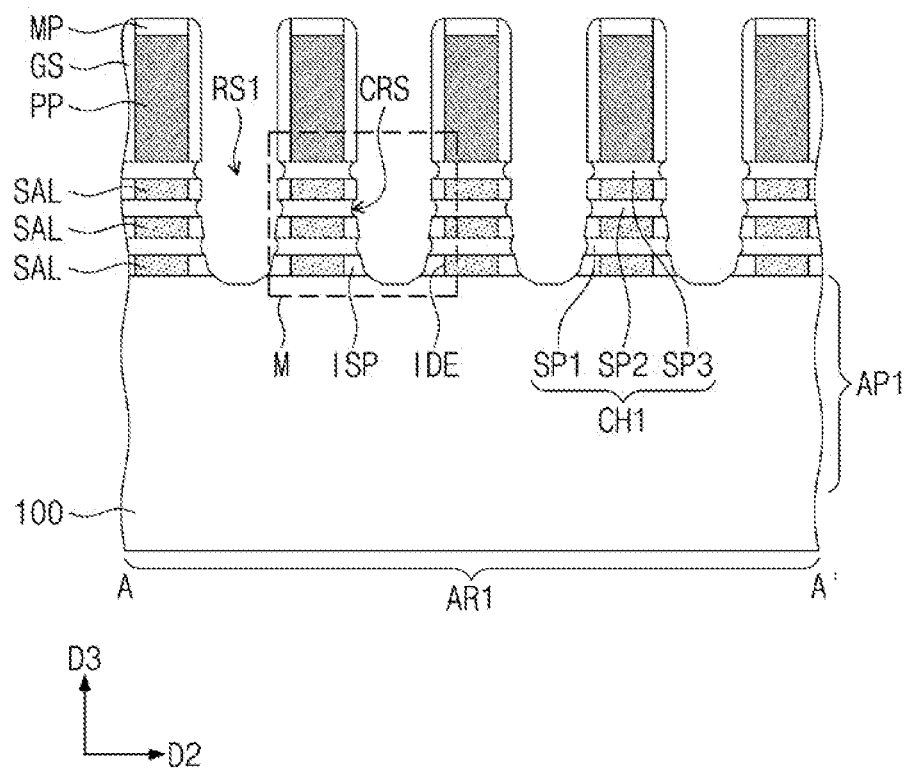
Figure 9B:
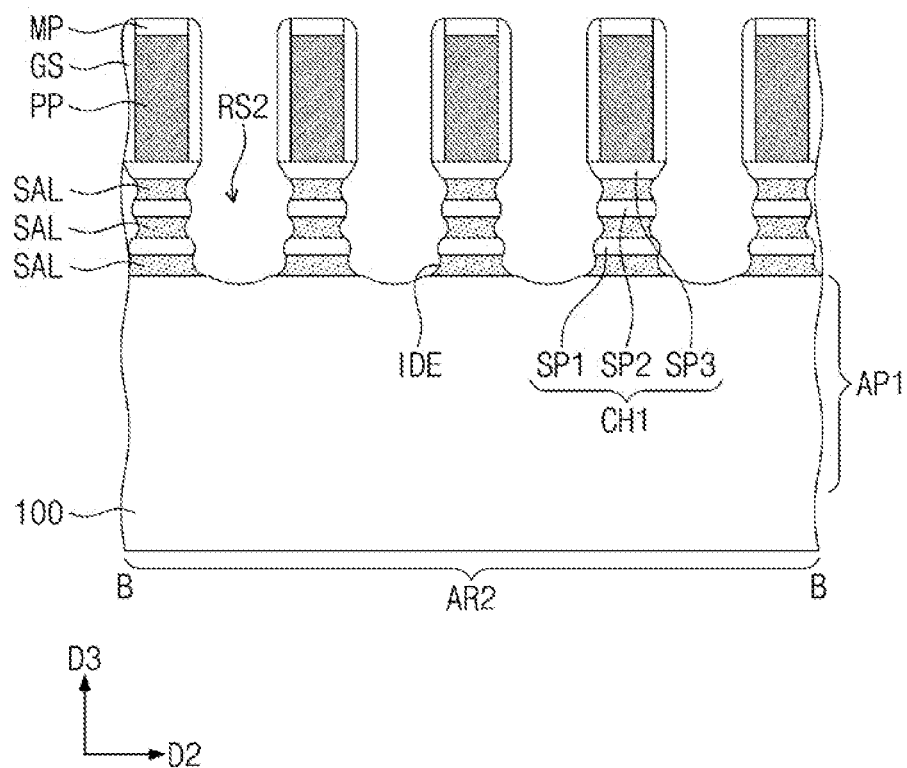
Figure 9C:
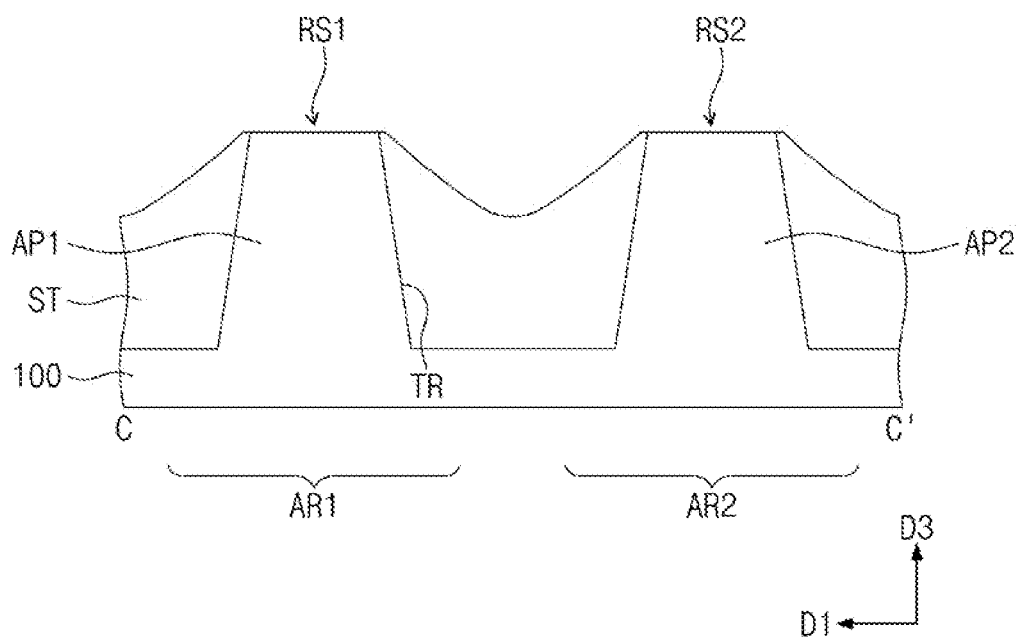

Referring to FIGS. 9A to 9C, first recesses RS1 may be formed in the stacked pattern STP on the first active pattern AP1. Second recesses RS2 may be formed in the stacked pattern STP on the second active pattern AP2. While the first and second recesses RS1 and RS2 are formed, the device isolation layer ST on both sides of each of the first and second active patterns AP1 and AP2 may be further recessed (refer to FIG. 9C).

In detail, the stacked pattern STP on the first active pattern AP1 may be etched using the hard mask patterns MA and the gate spacers GS as an etch mask to form the first recesses RS1. The first recess RS1 may be formed between the pair of sacrificial patterns PP.

First to third semiconductor patterns SP1, SP2, and SP3 sequentially stacked between the first recesses RS1 adjacent to each other may be formed from the active layers ACL, respectively. The first to third semiconductor patterns SP1, SP2, and SP3 between the first recesses RS1 adjacent to each other may constitute a first channel pattern CH1.

Figure 13:
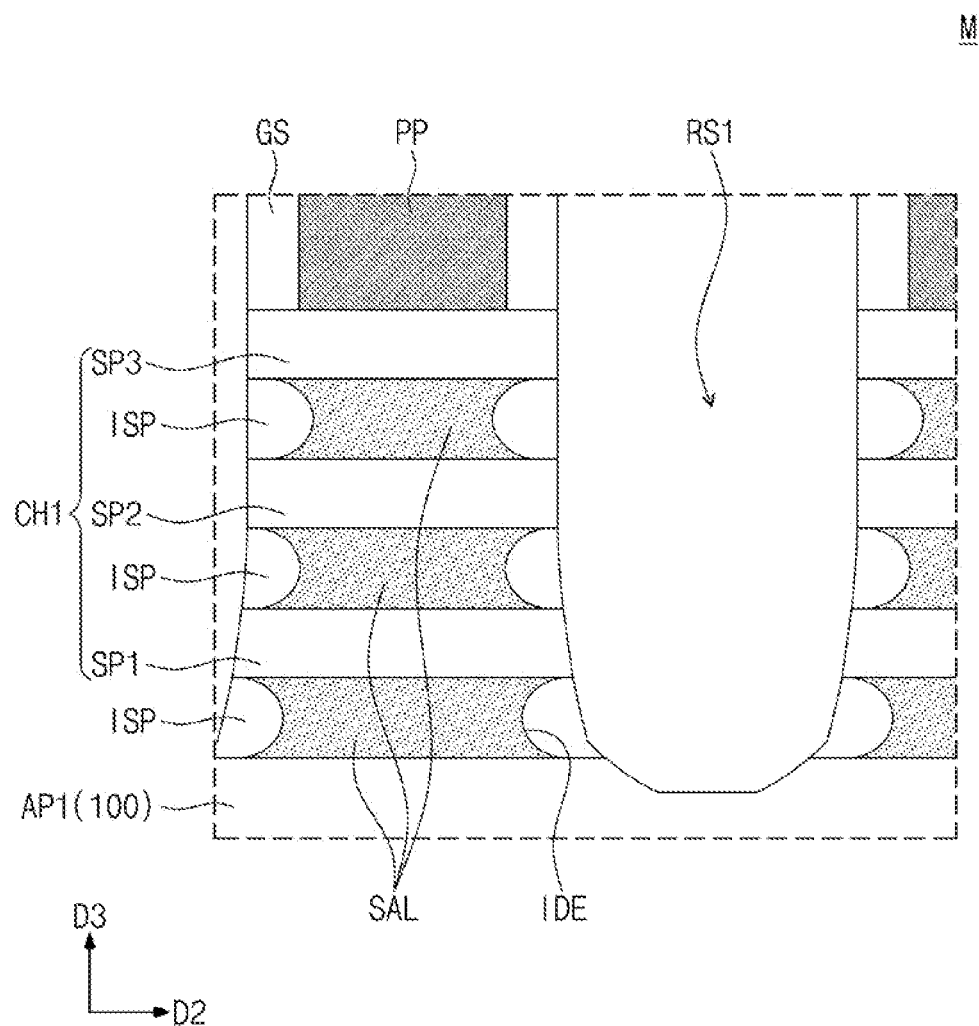
FIGS. 13 and 14 are enlarged views for illustrating a method of forming region "M" of FIG. 9A.
Figure 14:
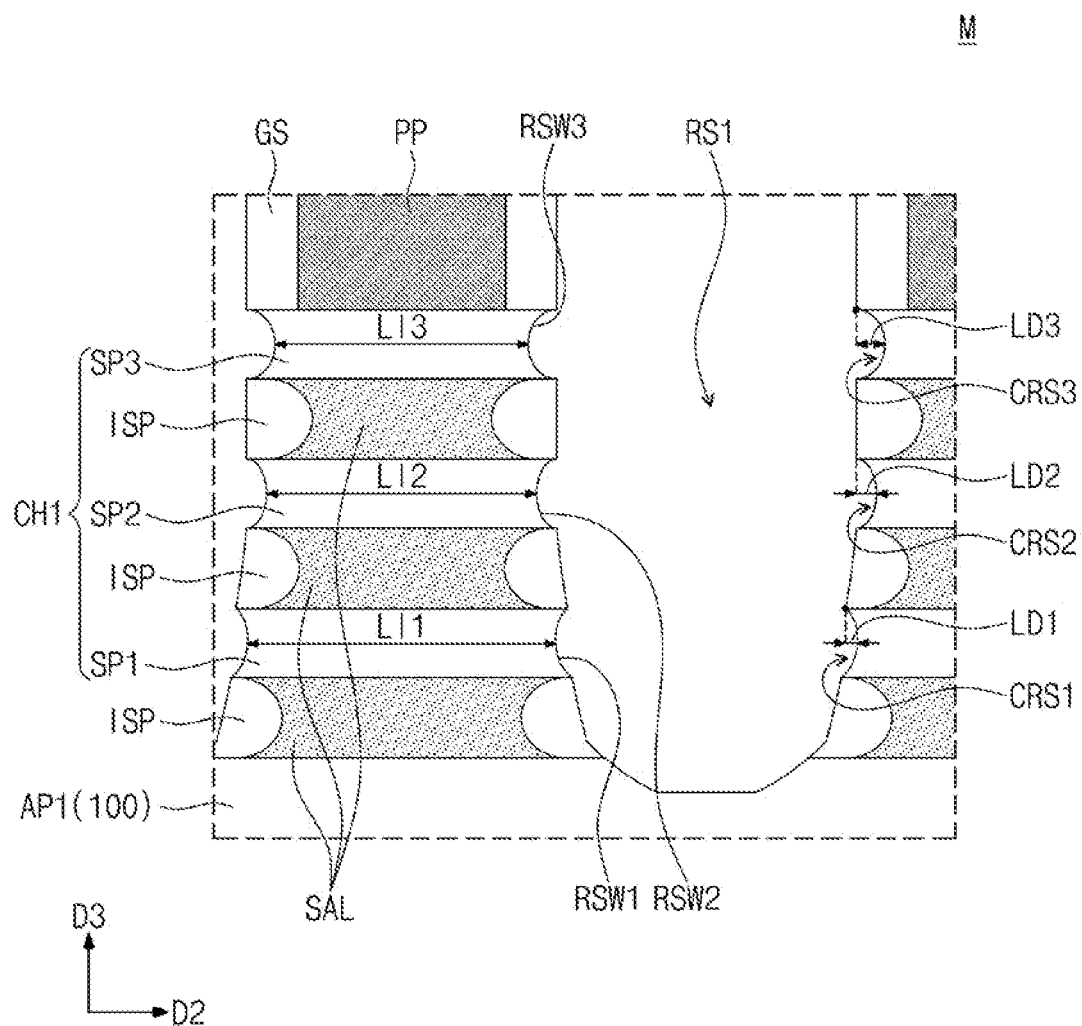

FIGS. 13 and 14 are enlarged views for illustrating a method of forming region "M" of FIG. 9A. Referring to FIG. 13, as described above, the first recess RS1 may be formed between the adjacent sacrificial patterns PP. A width of the first recess RS1 in the second direction D2 may decrease as the first recess RS1 approaches the substrate 100.

The sacrificial layers SAL may be exposed by the first recess RS1. A selective etching process may be performed on the exposed sacrificial layers SAL. The etching process may include a wet etching process for selectively removing only silicon-germanium. Each of the sacrificial layers SAL may be indented by the etching process, to form an indent region IDE. A sidewall of the sacrificial layer SAL may be concave due to the indent region IDE.

The inner spacer ISP may be formed to fill the indent region IDE. Forming the inner spacer ISP may include forming an insulating layer filling the indent region IDE through the first recess RS1 and wet etching the insulating layer exposed outside the indent region IDE. The insulating layer may include at least one of a silicon oxide layer, a silicon oxynitride layer, and a silicon nitride layer. The Inner spacers ISP may be respectively interposed between the first recess RS1 and the sacrificial layers SAL.

Referring to FIG. 14, even when the inner spacers ISP are formed, the first to third semiconductor patterns SP1, SP2, and SP3 may be exposed by the first recess RS1.

A selective etching process may be performed on the first to third semiconductor patterns SP1, SP2, and SP3 exposed by the first recess RS1. The etching process may include a wet etching process for selectively removing only silicon.

Each of the first to third semiconductor patterns SP1, SP2, and SP3 may be partially etched to form a channel recess CRS. In detail, the first semiconductor pattern SP1 may be horizontally recessed to form a first channel recess CRS1, and the second semiconductor pattern SP2 may be horizontally recessed to form a second channel recess CRS2, and the third semiconductor pattern SP3 may be horizontally recessed to form a third channel recess CRS3. The first recess RS1 may have a wavy inner wall due to the first to third channel recesses CRS1, CSR2, and CRS3.

The first concave sidewall RSW1 may be formed in the first semiconductor pattern SP1 by the first channel recess CRS1, the second concave sidewall RSW2 may be formed in the second semiconductor pattern SP2 by the second channel recess CRS2, and the third concave sidewall RSW3 may be formed in the third semiconductor pattern SP3 by the third channel recess CRS3.

The first semiconductor pattern SP1 may have the first length LI1 by the first channel recess CRS1, and the second semiconductor pattern SP2 may have the second length LI2 by the second channel recess CRS2 and the third semiconductor pattern SP3 may have a third length LI3 by the third channel recess CRS3. The second length LI2 may be greater than the third length LI3. The first length LI1 may be greater than the second length LI2.

The first channel recess CRS1 may be formed to have a first horizontal depth LD1, and the second channel recess CRS2 may be formed to have a second horizontal depth LD2, and the third channel recess CRS3 may be formed to have a third horizontal depth LD3. The second horizontal depth LD2 may be greater than the first horizontal depth LD1. The third horizontal depth LD3 may be greater than the second horizontal depth LD2.

Referring back to FIGS. 9A to 9C, a second recesses RS2 in the stacked pattern STP on the second active pattern AP2 may be formed in a manner similar to the forming of the first recesses RS1. A selective etching process may be performed on the sacrificial layers SAL exposed by the second recess RS2 to form indent regions IDE. The second recess RS2 may have a wavy inner wall due to the indent regions IDE. Inner spacers ISP may not be formed in the indent regions IDE on the second active pattern AP2. First to third semiconductor patterns SP1, SP2, and SP3 between the second recesses RS2 adjacent to each other may constitute a second channel pattern CH2.

Figure 10A:
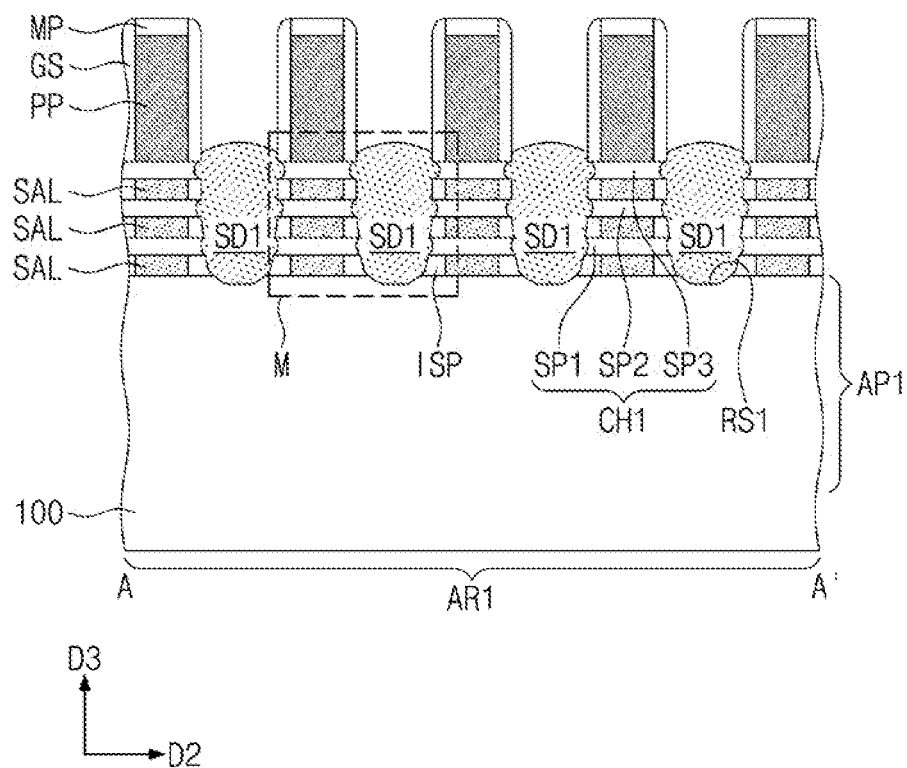
Figure 10B:
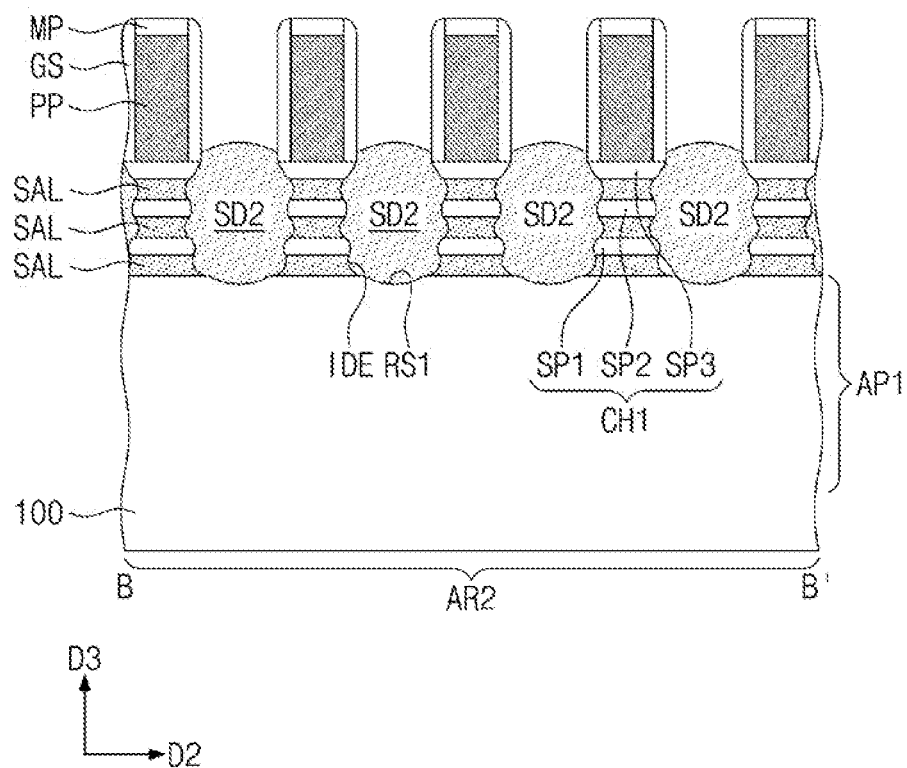
Figure 10C:
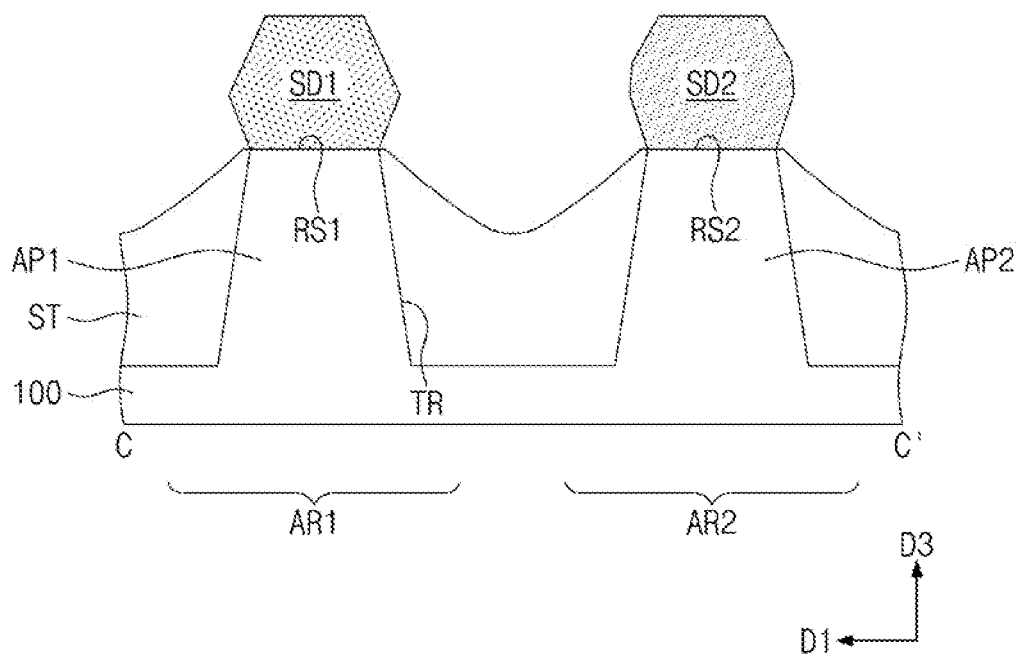

Referring to FIGS. 10A to 10C, first source/drain patterns SD1 may be respectively formed in the first recesses RS1. In detail, an SEG process may be performed using the inner wall of the first recess RS1 as a seed layer, and thus an epitaxial layer filling the first recess RS1 may be formed. The epitaxial layer may be grown using the first to third semiconductor patterns SP1, SP2, and SP3 exposed by the first recess RS1 and the substrate 100 as seeds. For example, the SEG process may include a chemical vapor deposition (CVD) process or a molecular beam epitaxy (MBE) process.

In some example embodiments of the inventive concepts, the first source/drain pattern SD1 may include the same semiconductor element (e.g., Si) as the substrate 100. While the first source/drain pattern SD1 is being formed, impurities (e.g., phosphorus, arsenic, or antimony) may be implanted in-situ such that the first source/drain pattern SD1 has an n-type. As another example, after the first source/drain pattern SD1 is formed, impurities may be implanted into the first source/drain pattern SD1.

Second source/drain patterns SD2 may be respectively formed in the second recesses RS2. In detail, an SEG process may be performed using the inner wall of the second recess RS2 as a seed layer, and thus the second source/drain pattern SD2 may be formed.

In some example embodiments of the inventive concepts, the second source/drain pattern SD2 may include a semiconductor element (e.g., SiGe) having a lattice constant greater than a lattice constant of the semiconductor element of the substrate 100. While the second source/drain pattern SD2 is formed, impurities (e.g., boron, gallium, or indium) may be implanted in-situ such that the second source/drain pattern SD2 has a p-type in-situ. As another example, after the second source/drain pattern SD2 is formed, impurities may be implanted into the second source/drain pattern SD2.

Figure 15:
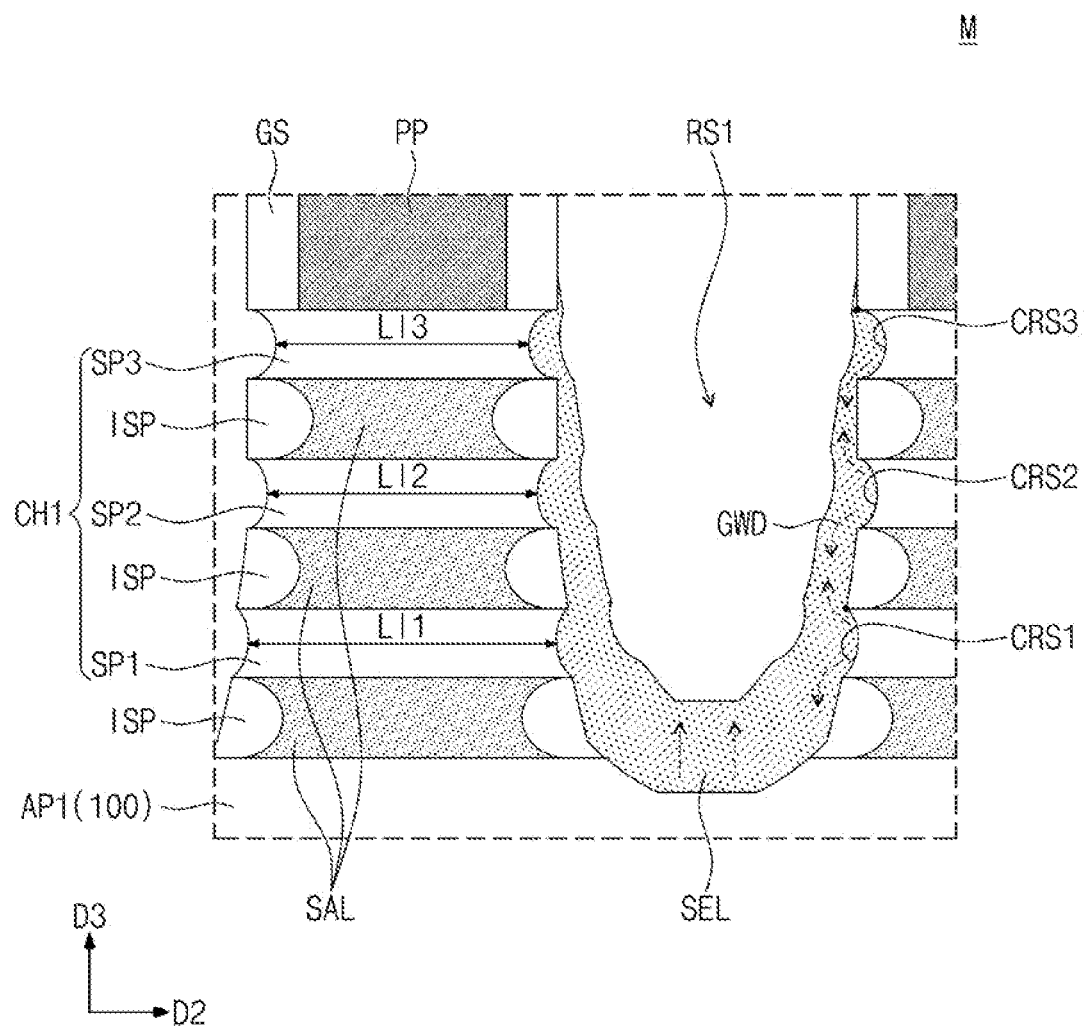
FIG. 15 is an enlarged view for illustrating a method of forming region "M" of FIG. 10A.

FIG. 15 is an enlarged view for illustrating a method of forming region "M" of FIG. 10A. Referring to FIG. 15, an SEG process may be performed using the first to third semiconductor patterns SP1, SP2, and SP3 and the first active pattern AP1 in the first recess RS1 as a seed layer. Accordingly, the epitaxial layer SEL may be grown in the first recess RS1.

The epitaxial layer SEL grown on the first to third semiconductor patterns SP1, SP2, and SP3 may fill the first to third channel recesses CRS1, CRS 2, and CRS3. The epitaxial layer SEL grown on the first active pattern AP1 may fill a lower portion of the first recess RS1.

The epitaxial layer SEL on the first to third semiconductor patterns SP1, SP2, and SP3 may predominantly grow in a <111> direction. Meanwhile, because the inner spacers ISP do not act as seeds, the epitaxial layer SEL may not be grown on the inner spacers ISP.

According to some example embodiments of the inventive concepts, even when a growth direction GWD of the epitaxial layer SEL is the <111> direction, the epitaxial layer SEL may be formed to cover all surfaces of the inner spacers ISP using the first to third channel recesses CRS1, CRS2, and CRS3. A horizontal growth length of the epitaxial layer SEL may increase using the first to third channel recesses CRS1, CRS2, and CRS3, and thus a time required for the epitaxial layer SEL to completely cover the inner spacer ISP may be secured.

Figure 16:
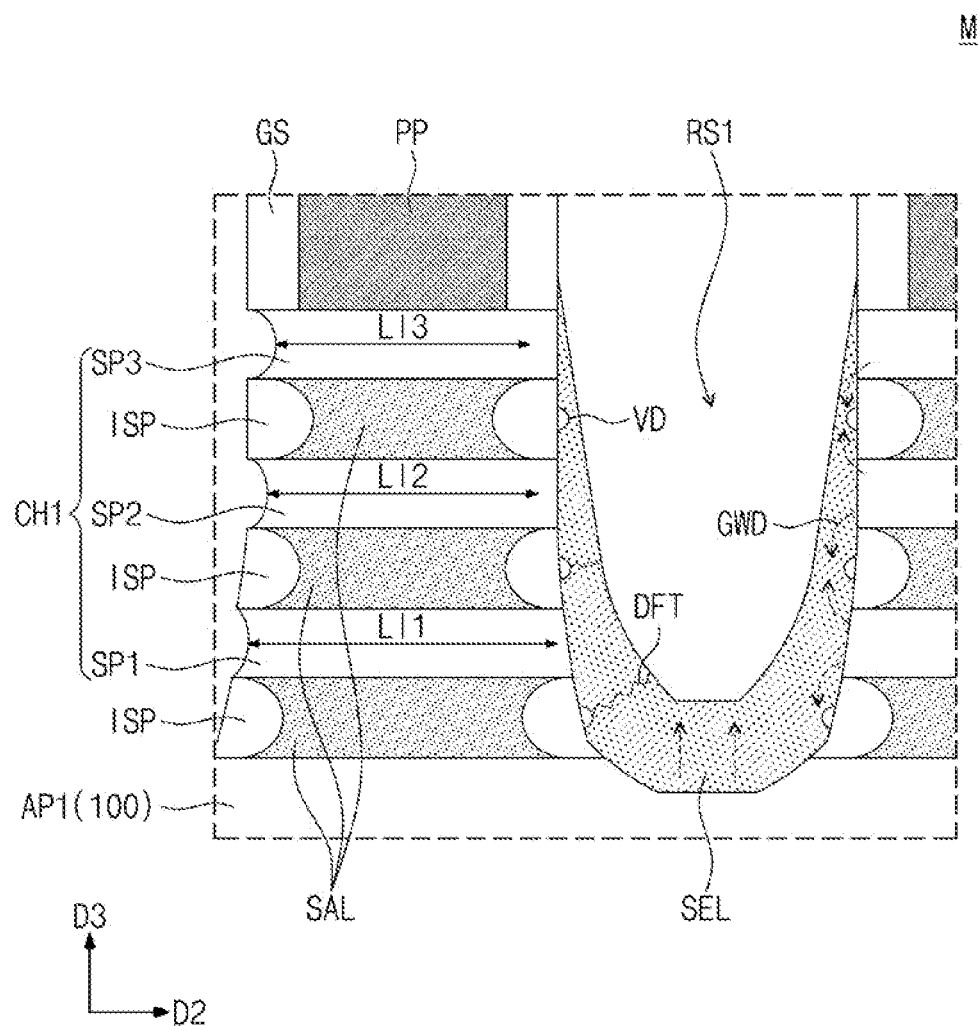
FIG. 16 is an enlarged view corresponding to region "M" of FIG. 10A for illustrating a method of forming a first source/drain pattern according to a comparative example of the inventive concepts.

FIG. 16 is an enlarged view corresponding to region "M" of FIG. 10A for illustrating a method of forming a first source/drain pattern according to a comparative example of the inventive concepts. Referring to FIG. 16, in the comparative example of the inventive concepts, formation of the first to third channel recesses CRS1 to CRS3 is omitted.

The SEG process may be directly performed on the first recess RS1 of FIG. 13. As described above, the epitaxial layer SEL on the first to third semiconductor patterns SP1, SP2, and SP3 may predominantly grow in the <111> direction. Accordingly, the epitaxial layer SEL may grow incompletely covering the inner spacer ISP. That is, the epitaxial layer SEL may only partially cover the inner spacer ISP.

According to this comparative example, a void VD may be formed between the epitaxial layer SEL and the inner spacer ISP. During the growth of the epitaxial layer SEL, lattice defects DFT may occur due to the voids VD. The lattice defect DFT may cause a defect in the first source/drain pattern SD1 and severely degrade device performance.

Referring back to FIG. 15, in the method of forming the first source/drain pattern SD1 according to some example embodiments of the inventive concepts, the epitaxial layer SEL may be formed to completely cover the inner spacer ISP without the void or with reduced void using the first to third channel recesses CRS1, CRS2, and CRS3, such that the formed first source/drain pattern SD1 includes the first, second, and third protrusions PRP1, PRP2, and PRP3 having different widths WI1, WI2, and WI3 in the second direction D2. Accordingly, the lattice defects DFT in the epitaxial layer SEL shown in FIG. 16 may be reduced or prevented. As a result, the method of manufacturing the semiconductor device according to some example embodiments of the inventive concepts may improve device reliability and ensure excellent electrical characteristics.

Figure 11A:
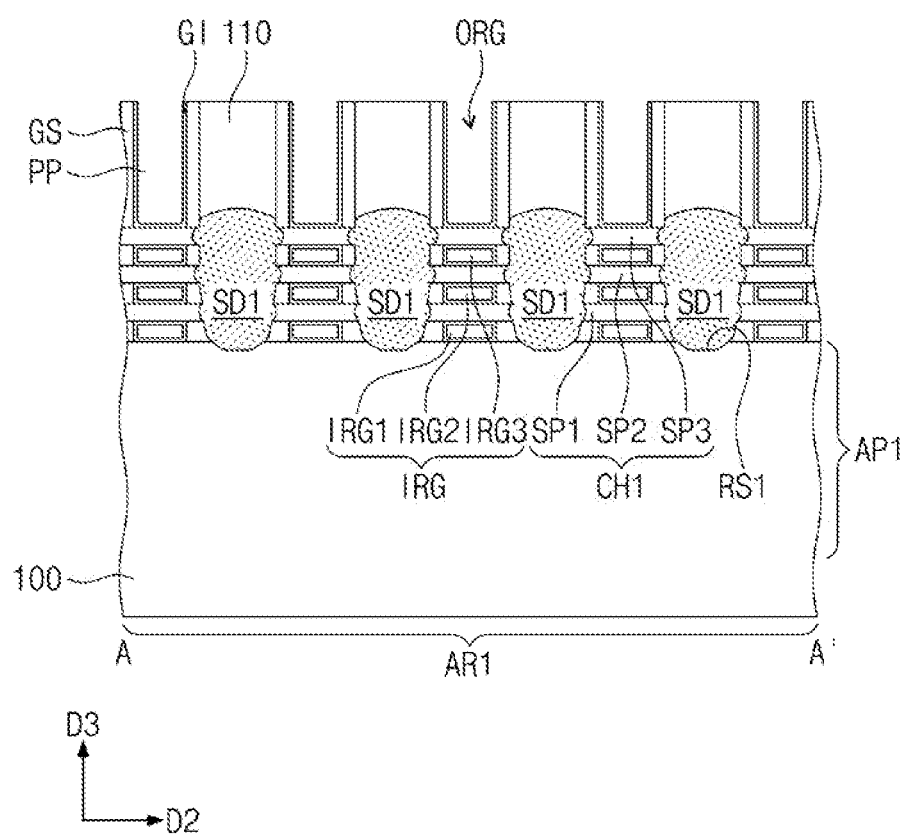
Figure 11B:
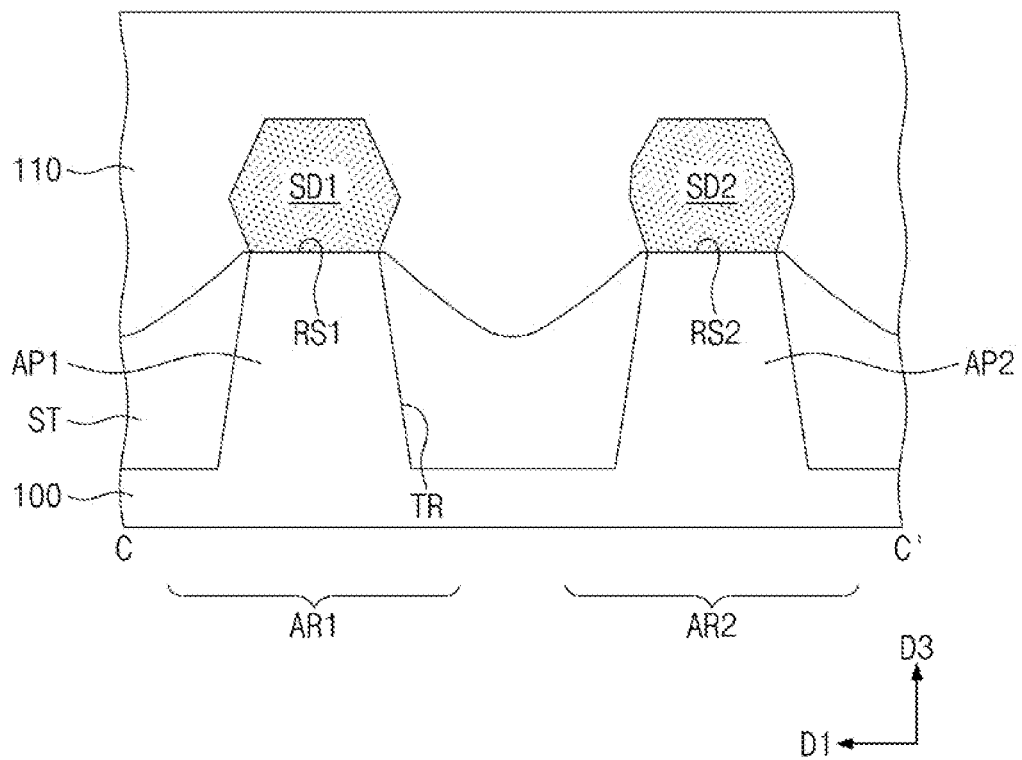
Figure 11C:
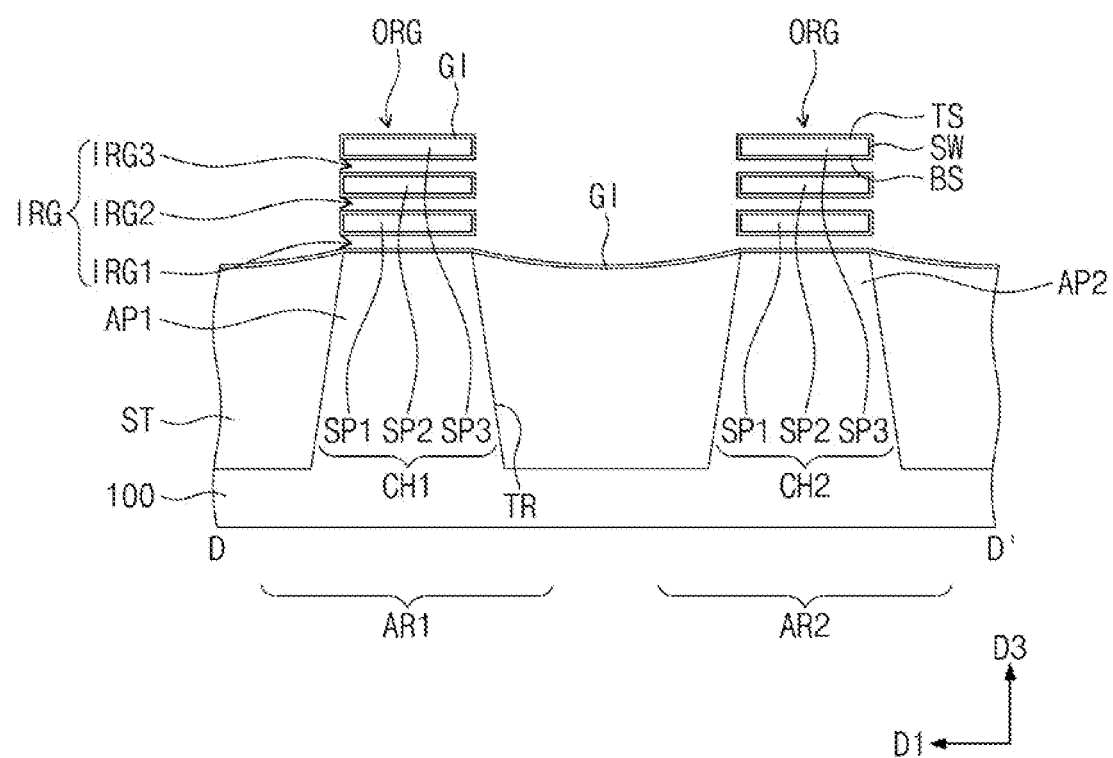

Referring to FIGS. 11A to 11C, a first interlayer insulating layer 110 covering the first and second source/drain patterns SD1 and SD2, the hard mask patterns MP, and the gate spacers GS may be formed. For example, the first interlayer insulating layer 110 may include a silicon oxide layer.

The first interlayer insulating layer 110 may be planarized until top surfaces of the sacrificial patterns PP are exposed. The planarization of the first interlayer insulating layer 110 may be performed using an etch-back or chemical mechanical polishing (CMP) process. During the planarization process, all of the hard mask patterns MP may be removed. As a result, a top surface of the first interlayer insulating layer 110 may be coplanar with top surfaces of the sacrificial patterns PP and top surfaces of the gate spacers GS.

The exposed sacrificial patterns PP may be selectively removed. As the sacrificial patterns PP are removed, an outer region ORG exposing the first and second channel patterns CH1 and CH2 may be formed (refer to FIG. 11C). The removing of the sacrificial patterns PP may include wet etching using an etchant that selectively etches polysilicon.

The sacrificial layers SAL exposed through the outer region ORG may be selectively removed to form inner regions IRG (refer to FIG. 11C). In detail, an etching process of selectively etching the sacrificial layers SAL may be performed, and thus only the sacrificial layers SAL may be removed while the first to third semiconductor patterns SP1, SP2, and SP3 remain. The etching process may have a high etch rate with respect to silicon-germanium having a relatively high germanium concentration. For example, the etching process may have a high etching rate for silicon-germanium having a germanium concentration greater than 10 at %.

During the etching process, the sacrificial layers SAL on the first and second active regions AR1 and AR2 may be removed. The etching process may be wet etching. The etching material used in the etching process may rapidly remove the sacrificial layer SAL having a relatively high germanium concentration.

Referring back to FIG. 11C, the sacrificial layers SAL may be selectively removed, only the stacked first to third semiconductor patterns SP1, SP2, and SP3 may remain on each of the first and second active patterns AP1 and AP2. First to third inner regions IRG1, IRG2, and IRG3 may be respectively formed through regions from which the sacrificial layers SAL are removed.

In detail, the first inner region IRG1 may be formed between the active pattern AP1 or AP2 and the first semiconductor pattern SP1, a second inner region IRG2 may be formed between the first semiconductor pattern SP1 and the second semiconductor pattern SP2, and the third inner region IRG3 may be formed between the second semiconductor pattern SP2 and the third semiconductor pattern SP3.

Referring again to FIGS. 11A to 11C, a gate insulating layer GI may be formed on the exposed first to third semiconductor patterns SP1, SP2, and SP3. The gate insulating layer GI may be formed to surround each of the first to third semiconductor patterns SP1, SP2, and SP3. The gate insulating layer GI may be formed in each of the first to third inner regions IRG1, IRG2, and IRG3. The gate insulating layer GI may be formed in the outer region ORG.

Figure 12A:
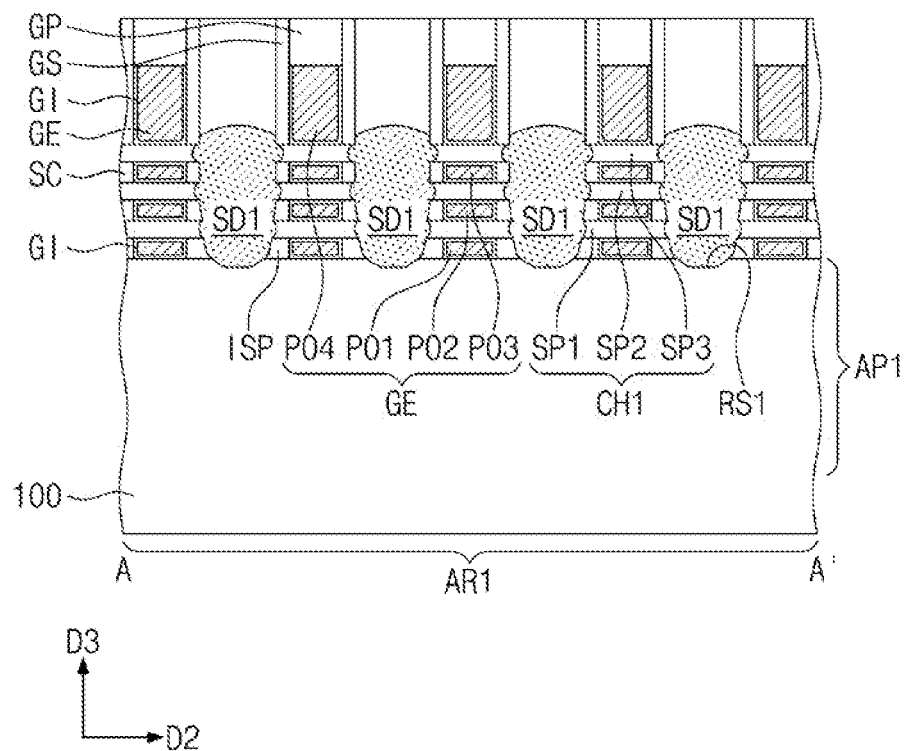
Figure 12B:
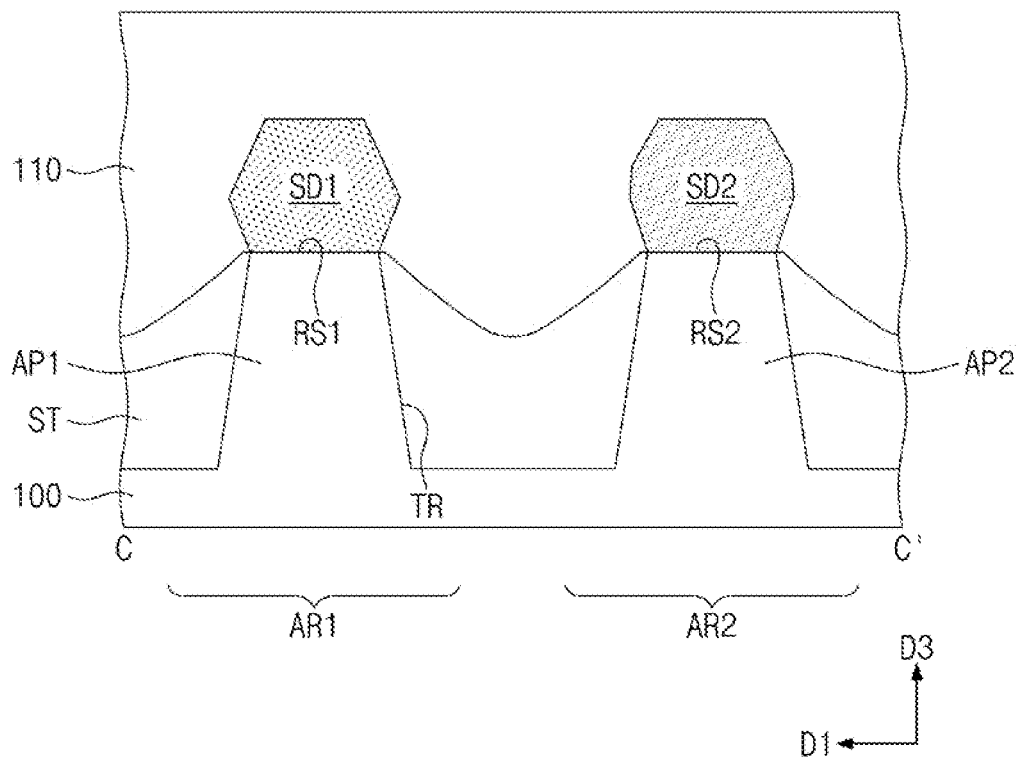
Figure 12C:
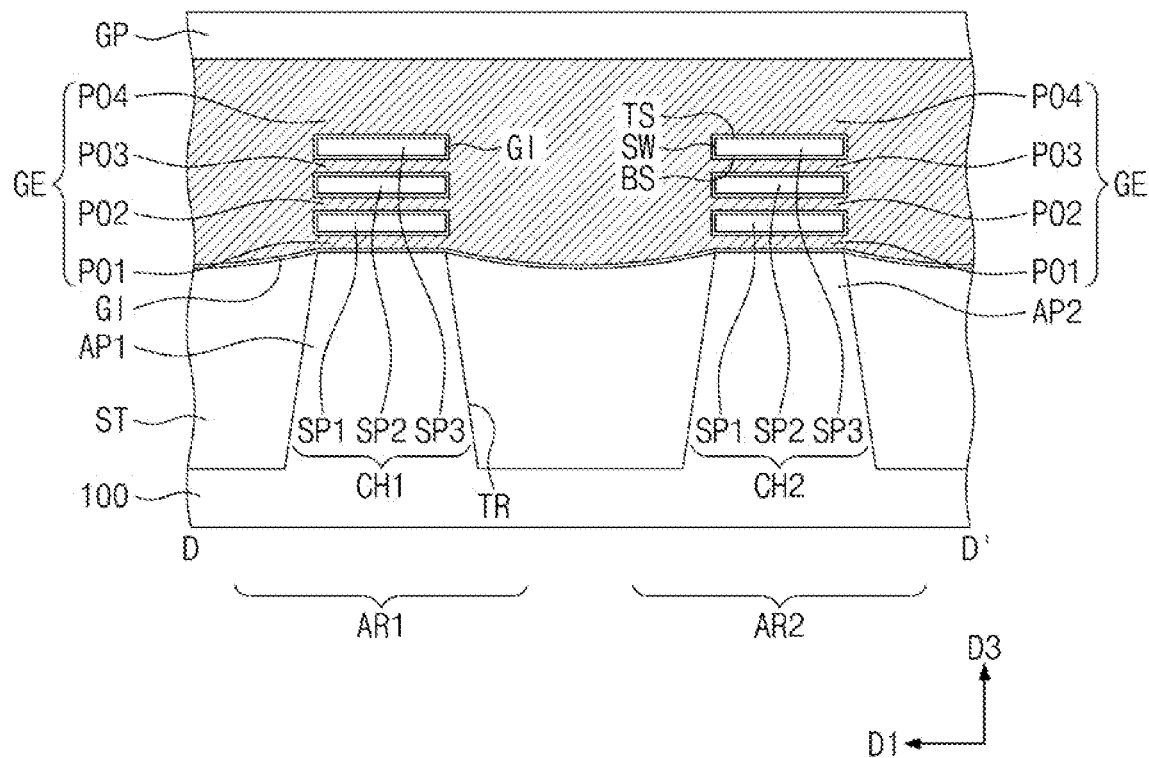

Referring to FIGS. 12A to 12C, a gate electrode GE may be formed on the gate insulating layer GI. The gate electrode GE may include the first to third portions PO1, PO2, and PO3 respectively formed in the first to third inner regions IRG1, IRG2, and IRG3, and a fourth portions PO4 formed in the outer region ORG. The gate electrode GE may be recessed, and thus a height thereof may be reduced. A gate capping pattern GP may be formed on the recessed gate electrode GE.

Referring back to FIGS. 5A to 5D, a second interlayer insulating layer 120 may be formed on the first interlayer insulating layer 110. The second interlayer insulating layer 120 may include a silicon oxide layer. Active contacts AC electrically connected to the first and second source/drain patterns SD1 and SD2 may be formed through the second interlayer insulating layer 120 and the first interlayer insulating layer 110. A gate contact GC electrically connected to the gate electrode GE may be formed through the second interlayer insulating layer 120 and the gate capping pattern GP.

The forming of each of the active contact AC and the gate contact GC may include forming a bather pattern BM and forming a conductive pattern FM on the bather pattern BM. The barrier pattern BM may be conformally formed and may include a metal layer/metal nitride layer. The conductive pattern FM may include a low-resistance metal.

Separation structures DB may be respectively formed on the first boundary BD1 and the second boundary BD2 of the single height cell SHC. The separation structure DB may extend into the active pattern AP1 or AP2 from the second interlayer insulating layer 120 through the gate electrode GE. The separation structure DB may include an insulating material such as a silicon oxide layer or a silicon nitride layer.

A third interlayer insulating layer 130 may be formed on the active contacts AC and the gate contacts GC. A first metal layer M1 may be formed in the third interlayer insulating layer 130. A fourth interlayer insulating layer 140 may be formed on the third interlayer insulating layer 130. A second metal layer M2 may be formed in the fourth interlayer insulating layer 140.

Hereinafter, some example embodiments of the inventive concepts will be described. In some example embodiments of the inventive concepts to be described later, detailed descriptions of technical features overlapping those described above with reference to FIGS. 1 to 6B will be omitted, and differences will be described in detail.

Figure 17:
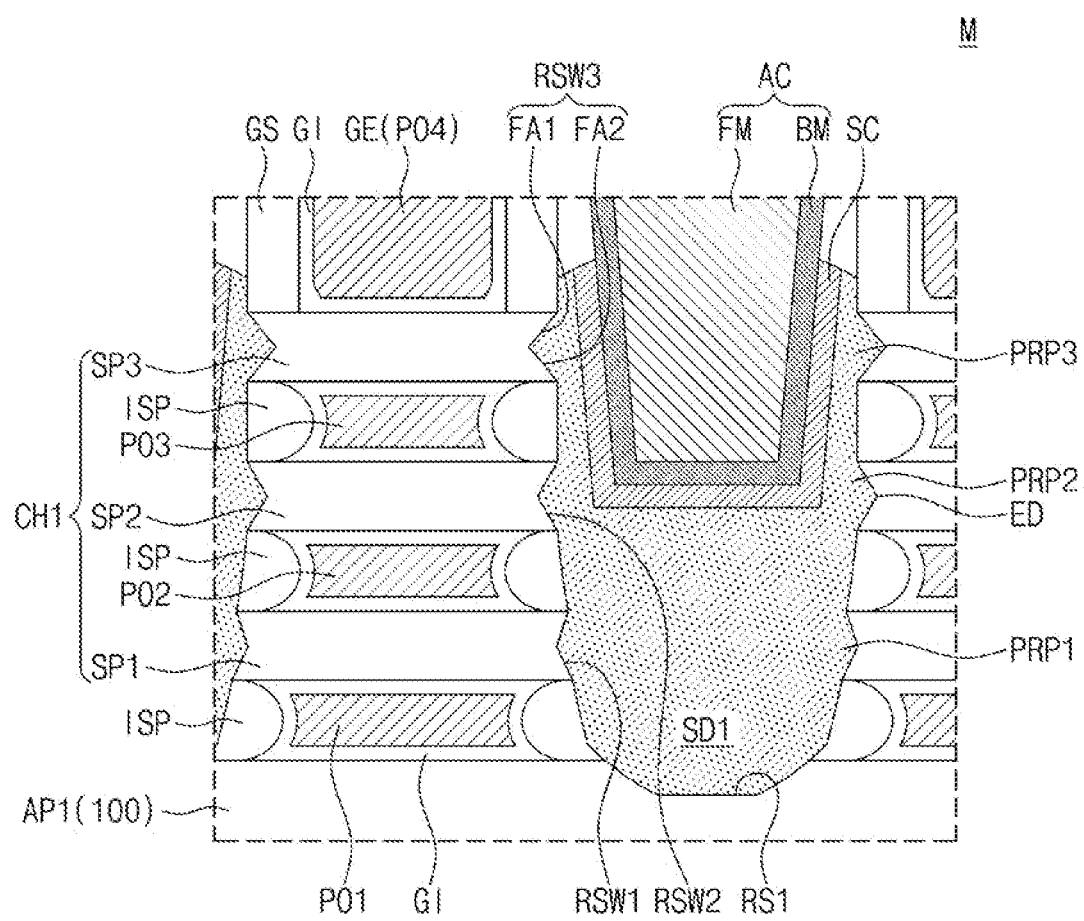
FIG. 17 is an enlarged view illustrating some example embodiments of region "M" of FIG. 5A.

FIG. 17 is an enlarged view illustrating some example embodiments of region "M" of FIG. 5A. Referring to FIG. 17, each of the first to third protrusions PRP1, PRP2, and PRP3 may include a sharp edge ED. The first to third semiconductor patterns SP1, SP2, and SP3 may include first to third concave sidewalls RSW1, RSW2, and RSW3 respectively corresponding to the first to third protrusions PRP1, PRP2 and PRP3.

Each of the first to third concave sidewalls RSW1, RSW2, and RSW3 may include a first surface FA1 and a second surface FA2. The first surface FA1 and the second surface FA2 may meet each other to define the above-described edge ED. Each of the first and second surfaces FA1 and FA2 may be a {111} crystal plane of silicon.

Figure 18:
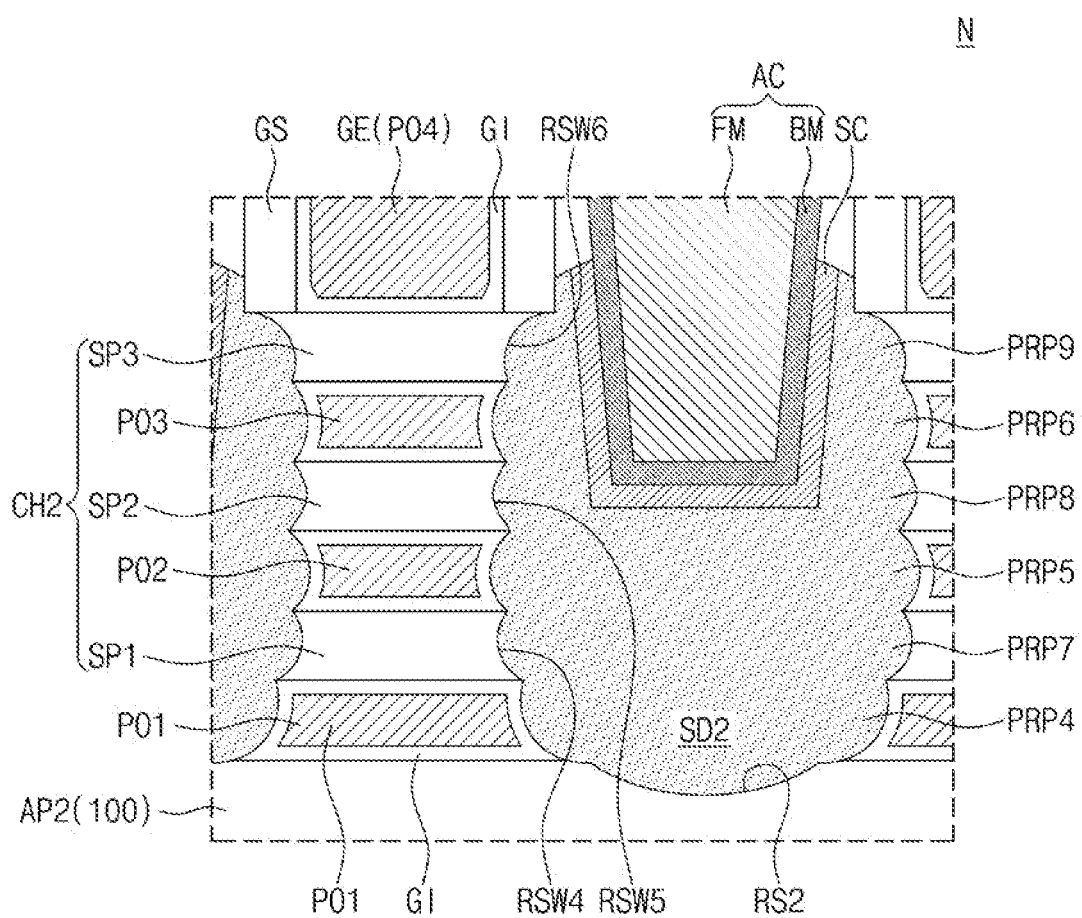
FIG. 18 is an enlarged view illustrating some example embodiments of region "N" of FIG. 5B.

FIG. 18 is an enlarged view illustrating some example embodiments of region "N" of FIG. 5B. Referring to FIG. 18, the second source/drain pattern SD2 may further include not only the fourth to sixth protrusions PRP4, PRP5, and PRP6 but also seventh to ninth protrusions PRP7, PRP8, and PRP9. The seventh to ninth protrusions PRP7, PRP8, and PRP9 may protrude toward the first to third semiconductor patterns SP1, SP2, and SP3, respectively.

The seventh to ninth protrusions PRP7, PRP8, and PRP9 of the second source/drain pattern SD2 may be formed in the same manner as the first to third protrusions PRP1, PRP2, and PRP3 of the first source/drain pattern SD1. The first to third semiconductor patterns SP1, SP2, and SP3 of the second channel pattern CH2 may include first to third concave sidewalls RSW1, RSW2, and RSW3, respectively by the seventh to ninth protrusions PRP7, PRP8, and PRP9.

The three-dimensional field effect transistor according to the inventive concepts may provide the epitaxial layer (i.e., the seed layer) for forming the source/drain pattern using the channel recess. The inventive concepts may provide the source/drain pattern without the voids and lattice defects or with reduced voids and lattice defects, thereby improving the electrical characteristics and reliability of the semiconductor device, for example based on the semiconductor device including a first source/drain pattern SD1 including first, second, and third protrusions PRP1, PRP2, and PRP3 having different widths WI1, WI2, and WI3 in the second direction D2.

While some example embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising:
a substrate including a first active pattern;
a first channel pattern on the first active pattern, the first channel pattern including a first semiconductor pattern, a second semiconductor pattern, and a third semiconductor pattern spaced apart from one another and vertically stacked in a vertical direction, the vertical direction extending perpendicular to an upper surface of the substrate;
a first source/drain pattern connected to the first semiconductor pattern, the second semiconductor pattern, and the third semiconductor pattern; and
a gate electrode on the first semiconductor pattern, the second semiconductor pattern, and the third semiconductor pattern,
wherein the first source/drain pattern includes a first protrusion protruding toward the first semiconductor pattern in a horizontal direction, a second protrusion protruding toward the second semiconductor pattern in the horizontal direction, and a third protrusion protruding toward the third semiconductor pattern in the horizontal direction, the horizontal direction extending parallel to the upper surface of the substrate,
wherein a width of the second protrusion in the horizontal direction is greater than a width of the first protrusion in the horizontal direction,
wherein a width of the third protrusion in the horizontal direction is greater than the width of the second protrusion in the horizontal direction,
wherein a length of the second semiconductor pattern in the horizontal direction is greater than a length of the third semiconductor pattern in the horizontal direction, and
wherein a length of the first semiconductor pattern in the horizontal direction is greater than the length of the second semiconductor pattern in the horizontal direction.

2. The semiconductor device of claim 1, wherein
the first semiconductor pattern includes a first concave sidewall in contact with the first protrusion,
the second semiconductor pattern includes a second concave sidewall in contact with the second protrusion, and
the third semiconductor pattern includes a third concave sidewall in contact with the third protrusion.

3. The semiconductor device of claim 2, wherein
each of the first concave sidewall, the second concave sidewall, and the third concave sidewall includes a first surface and a second surface,
each of the first surface and the second surface is a {111} crystal plane, and
the first surface and the second surface meet to define an edge of each of the first protrusion, the second protrusion, and the third protrusion.

4. The semiconductor device of claim 1, further comprising at least one inner spacer between the gate electrode and the first source/drain pattern,
wherein the first protrusion, the second protrusion, and the third protrusion are spaced apart from one another in the vertical direction with the at least one inner spacer therebetween.

5. The semiconductor device of claim 4, wherein a width of the at least one inner spacer in the horizontal direction is greater than the width of the third protrusion in the horizontal direction.

6. The semiconductor device of claim 4, further comprising a gate insulating layer between the gate electrode and each of the first semiconductor pattern, the second semiconductor pattern, and the third semiconductor pattern,
wherein the gate insulating layer is in contact with the at least one inner spacer.

7. The semiconductor device of claim 1, further comprising:
a second channel pattern on a second active pattern of the substrate, the second channel pattern including a fourth semiconductor pattern, a fifth semiconductor pattern, and a sixth semiconductor pattern spaced apart from one another and vertically stacked in the vertical direction; and
a second source/drain pattern connected to the fourth semiconductor pattern, the fifth semiconductor pattern, and the sixth semiconductor pattern,
wherein the second source/drain pattern has a conductivity type that is different from a conductivity type of the first source/drain pattern,
wherein the gate electrode extends from the first channel pattern to the second channel pattern,
wherein the gate electrode includes a first portion, a second portion, and a third portion adjacent to the fourth semiconductor pattern, the fifth semiconductor pattern, and the sixth semiconductor pattern, respectively, and
wherein the second source/drain pattern include a fourth protrusion protruding toward the first portion in the horizontal direction, a fifth protrusion protruding toward the second portion in the horizontal direction, and a sixth protrusion protruding toward the third portion in the horizontal direction.

8. The semiconductor device of claim 7, wherein
the fourth semiconductor pattern includes a first convex sidewall between the fourth protrusion and the fifth protrusion, and
wherein the fifth semiconductor pattern includes a second convex sidewall between the fifth protrusion and the sixth protrusion.

9. The semiconductor device of claim 7, wherein
a length of the fourth semiconductor pattern in the horizontal direction is greater than a length of the fifth semiconductor pattern in the horizontal direction, and
wherein a length of the sixth semiconductor pattern in the horizontal direction is greater than the length of the fourth semiconductor pattern in the horizontal direction.

10. A semiconductor device, comprising:
a substrate including a first active pattern and a second active pattern;
a first channel pattern on the first active pattern, the first channel pattern including a first semiconductor pattern, a second semiconductor pattern, and a third semiconductor pattern spaced apart from one another and vertically stacked in a vertical direction, the vertical direction extending perpendicular to an upper surface of the substrate;
a second channel pattern on the second active pattern, the second channel pattern including a fourth semiconductor pattern, a fifth semiconductor pattern, and a sixth semiconductor pattern spaced apart from one another and vertically stacked in the vertical direction;
a first source/drain pattern connected to the first semiconductor pattern, the second semiconductor pattern, and the third semiconductor pattern;
a second source/drain pattern connected to the fourth semiconductor pattern, the fifth semiconductor pattern, and the sixth semiconductor pattern; and
a gate electrode extending from the first channel pattern to the second channel pattern,
wherein the second source/drain pattern has a conductivity type that is different from a conductivity type of the first source/drain pattern,
wherein the gate electrode includes a first portion, a second portion, and a third portion adjacent to each of the fourth semiconductor pattern, the fifth semiconductor pattern, and the sixth semiconductor pattern,
wherein the first source/drain pattern includes a first protrusion protruding toward the first semiconductor pattern in a horizontal direction, a second protrusion protruding toward the second semiconductor pattern in the horizontal direction, and a third protrusion protruding toward the third semiconductor pattern in the horizontal direction, the horizontal direction extending parallel to the upper surface of the substrate,
wherein the second source/drain pattern includes a fourth protrusion protruding toward the first portion in the horizontal direction, a fifth protrusion protruding toward the second portion in the horizontal direction, and a sixth protrusion protruding toward the third portion in the horizontal direction,
wherein a length of the second semiconductor pattern in the horizontal direction is greater than a length of the third semiconductor pattern in the horizontal direction, and
wherein a length of the fifth semiconductor pattern in the horizontal direction is smaller than a length of the sixth semiconductor pattern in the horizontal direction.

11. The semiconductor device of claim 10, further comprising at least one inner spacer between the gate electrode and the first source/drain pattern,
wherein the at least one inner spacer is omitted between the gate electrode and the second source/drain pattern.

12. The semiconductor device of claim 10, wherein
the first semiconductor pattern, the second semiconductor pattern, and the third semiconductor pattern include a first convex sidewall, a second convex sidewall, and a third convex sidewall, respectively, the first convex sidewall, the second convex sidewall, and the third convex sidewall in contact with the first protrusion, the second protrusion, and the third protrusion, respectively, and
the fourth semiconductor pattern, the fifth semiconductor pattern, and the sixth semiconductor pattern include a fourth convex sidewall, a fifth convex sidewall, and a sixth convex sidewall, respectively, the fourth convex sidewall, the fifth convex sidewall, and the sixth convex sidewall protruding toward the second source/drain pattern.

13. The semiconductor device of claim 10, wherein
a width of the second protrusion in the horizontal direction is greater than a width of the first protrusion in the horizontal direction, and
a width of the third protrusion in the horizontal direction is greater than the width of the second protrusion in the horizontal direction.

14. A semiconductor device, comprising:

a substrate including an active region;

a device isolation layer defining an active pattern on the active region;

a channel pattern and a source/drain pattern on the active pattern, the channel pattern including a first semiconductor pattern, a second semiconductor pattern, and a third semiconductor pattern spaced apart from one another and vertically stacked in a vertical direction, the vertical direction extending perpendicular to an upper surface of the substrate;

a gate electrode on the first semiconductor pattern, the second semiconductor pattern, and the third semiconductor pattern;

a gate insulating layer between the first semiconductor pattern, the second semiconductor pattern, and the third semiconductor pattern and the gate electrode;

a gate spacer on a sidewall of the gate electrode;

a gate capping pattern on a top surface of the gate electrode;

an interlayer insulating layer on the gate capping pattern;

an active contact electrically connected to the source/drain pattern through the interlayer insulating layer;

a metal-semiconductor compound layer interposed between the active contact and the source/drain pattern;

a gate contact passing through the interlayer insulating layer and the gate capping pattern and electrically connected to the gate electrode;

a first metal layer on the interlayer insulating layer, the first metal layer including a power wiring and first wirings electrically connected to the active contact and the gate contact, respectively; and a second metal layer on the first metal layer, wherein the second metal layer includes second wirings electrically connected to the first metal layer, wherein the source/drain pattern includes a first protrusion protruding toward the first semiconductor pattern in a horizontal direction, a second protrusion protruding toward the second semiconductor pattern in the horizontal direction, and a third protrusion protruding toward the third semiconductor pattern in the horizontal direction, the horizontal direction extending parallel to the upper surface of the substrate, wherein a length of the second semiconductor pattern in the horizontal direction is greater than a length of the third semiconductor pattern in the horizontal direction, and wherein a length of the first semiconductor pattern in the horizontal direction is greater than the length of the second semiconductor pattern in the horizontal direction.

15. The semiconductor device of claim 14, wherein a width of the second protrusion in the horizontal direction is greater than a width of the first protrusion in the horizontal direction, and a width of the third protrusion in the horizontal direction is greater than the width of the second protrusion in the horizontal direction.

16. The semiconductor device of claim 14, wherein the first semiconductor pattern includes a first concave sidewall in contact with the first protrusion, the second semiconductor pattern includes a second concave sidewall in contact with the second protrusion, and the third semiconductor pattern includes a third concave sidewall in contact with the third protrusion.

17. The semiconductor device of claim 14, further comprising at least one inner spacer between the gate electrode and the source/drain pattern, wherein the first protrusion, the second protrusion, and the third protrusion are spaced apart from one another in the vertical direction with the at least one inner spacer therebetween.

18. The semiconductor device of claim 17, wherein a width of the at least one inner spacer in the horizontal direction is greater than a width of the third protrusion in the horizontal direction.

* * * * *